(12) United States Patent
Dehon et al.

(10) Patent No.: US 7,617,470 B1
(45) Date of Patent: Nov. 10, 2009

(54) RECONFIGURABLE INTEGRATED CIRCUIT AND METHOD FOR INCREASING PERFORMANCE OF A RECONFIGURABLE INTEGRATED CIRCUIT

(75) Inventors: Andre M. Dehon, Pasadena, CA (US); Benjamin Gojman, Philadelphia, PA (US)

(73) Assignee: California Institute of Technology, Pasadena, CA (US)

( * ) Notice: Subject to any disclaimer, the term of this patent is extended or adjusted under 35 U.S.C. 154(b) by 226 days.

(21) Appl. No.: 11/546,526

(22) Filed: Oct. 10, 2006

Related U.S. Application Data

(60) Provisional application No. 60/725,252, filed on Oct. 11, 2005, provisional application No. 60/772,424, filed on Feb. 10, 2006.

(51) Int. Cl.
*G06F 17/50* (2006.01)
(52) U.S. Cl. .......................... 716/16; 716/17
(58) Field of Classification Search ............. 716/3, 716/5, 16–17
See application file for complete search history.

(56) References Cited

U.S. PATENT DOCUMENTS

| 5,475,605 | A * | 12/1995 | Lin | ............................ 716/6 |
| 6,340,901 | B1 | 1/2002 | Molnar | |
| 7,373,538 | B1 * | 5/2008 | Eldin et al. | ................. 713/400 |
| 2004/0060032 | A1 * | 3/2004 | McCubbrey | ................. 716/16 |

OTHER PUBLICATIONS

Alfred K. Yeung et al. "A 2.4-GOPS Data-Drivern Reconfigurable Multiprocessor IC for DSP," Proceeding of the 1995 IEE Internatinal Solis-State Circuits Conference, pp. 108-109.
Seth C. Goldstein et al. "PipeRench; A Coprocessor for Streaming Multimedia Acceleration" ISCA, pp. 28-39, May 1999.
Helia Naeimi et al. "A Greedy Algorithm for Tolerating Defective Crosspoints in Nano PLA Design", IEEE International Conference on Field-Programmable Technology, Dec. 6-8, 2004, pp. 1-9.
Vaughn Betz et al. "VPR: A New Packing Placement and Routing Tool for FPGA Research", 1997 Internatinal Workshop on Field Programmable Logic and Applications,pp. 1-10.
Dmitri B. Strukov et al. "A Reconfigurable Architecture for Hybrid CMOS/Nanodevice Circuits", FPGA3 06, Feb. 22-24, 2006.
Dmitri B. Strukov et al. CMOL FPGA: a reconfigurable architecture for hybrid digital circuits with two-terminal nanodevices, Nanotechnology vol. 16, Apr. 19, 2005, pp. 888-900.
Dev C. Chen et al. "A Reconfigurable Multiprocessor IC for Rapid Prototyping of Algorithmic-Specific High-Speed DSP Data Paths",IEEE Journal of Solid-state circuits, vol. 27, No. 12 Dec. 1992, pp. 1895-1904.

(Continued)

*Primary Examiner*—Vuthe Siek
(74) *Attorney, Agent, or Firm*—Steinfl & Bruno

(57) ABSTRACT

Methods are disclosed to increase yielded performance of a reconfigurable integrated circuit; improve performance of an application running on a reconfigurable integrated circuit; reduce degradation of an integrated circuit over time; and maintain performance of an integrated circuit time.

6 Claims, 19 Drawing Sheets

OTHER PUBLICATIONS

Greg Snider et al. "CMOS-like logic in defective, nanoscale crossbars", Nanotechnology vol. 15, Jun. 9, 2004, pp. 881-891.

Mattia Ruffoni et al. "Direct Measures of Path Delays on Commercial FPGA Chips", Signal Propagation on Interconnects, 6$^{th}$ IEEE Workshop on. Proceedings, May 12-15, 2002, pp. 157-159.

John Emmert et al. "Dynamic Fault Tolerance in FPGAs via Partial Reconfiguration", 2000, pp. 165-174.

Xiao-Yu Li et al. "FPGA as Process Monitor-An Effective Method to Characterize Poly Gate C Variation and its Impact on Product Performance and Yield", IEEE Transactions on Semiconductor Manufacturing, vol. 17, No. 3, Aug. 2004, pp. 267-272.

Todd Austin et al., "Making Typical Silicon Matter with Razor", IEEE Computer Society, Mar. 2004, pp. 57-65.

Ethan Mirsky et al. "MATRIX: A Reconfigurable Computing Architecture with Configurable Instruction Distribution and Deployable Resources", FCCM'96-IEEE Symposium on FPGA's for Custom Computing Machines, Apr. 17-19, 1996, Pages.

Seth Copen Goldstein et al. "NanoFabrics: Spatial Computing Using Molecular Electronics", Proc. Of the 28$^{th}$ Annual International Symposium on Computer Architecture, Jun. 2001, pp. 1-12.

Victor A. Sverdlov et al. "Nanoscale silicon MOSFETs : A Theoretical Study", IEEE Transactions on electron devices, vol. 50, No. 9, Sep. 9, 2003.

Andre Dehin, "Nanowire Based Programmable Architectures", ACM Journal on Emerging Technologies in Computing Systems, vol. 1, No. 2, Jul. 2005, pp. 109-162.

Charles Stroud et al. "On-Line BIST and Diagnosis of FPGA Interconnect Using Roving STARs", On-Line Testing Workshop, 2001. Proceedings. Seventh International, 2001, pp. 27-33.

Larry McMurchie et al. "Pathfinder: A Negotiation-Based Performance-Driven Router for FPGAs", Proceedings of the third ACM Symposium on Field-Programmable Gate Arrays , Monterey, Feb. 1995, pp. 111-117.

S. Kirkpatrick et al., "Optimization by Simulated Annealing", vol. 220, No. 4598, May 13, 1983, pp. 671 to 680.

Carl Ebeling at al. "RaPID-Reconfigurable Pipelined Datapath", pp. 126-135.

Andre Dehon et al. "Seven Strategies for Tolerating Highly Defective Fabrication", Advanced Technologies and Reliable Design for Nanotechnology System, Jul.-Aug. 2005, pp. 306-315.

Andre Dehon et al. "Stream computations organized for reconfigurable execution", Microprocessor and Microsystems 30, Mar. 2006, pp. 334-354.

Yi Luo et al. "Two-Dimensiona Molecular Electronics Circuits", Chemphyschem, 2002, pp. 519-525.

Subhasish Mitra et al., "Which Concurrent Error Detecting Scheme to Choose", Proceedings of the 2000 IEEE International Test Conference, 2000, p. 985.

Kazuya Katsuki et al. "A Yield and Speed Enhancement Scheme under Within-die Variations on 90nm LUT Array", IEEE 2005 Custom Integrated Circuits Conference, 2005, pp. 601-604.

Xiao-Yu Li et al., "FPGA as Process Monitor An Effective Method to Characterize Poly Gate CD Variation and its Impact on Product Performance and Yield", IEEE Transactions on Semiconductor Manufacturing, vol. 17, No. 3, Aug. 2004, pp. 267-272.

PCT International Search Report for PCT/US2006/039779 in the name of California Institute of Technology filed on Oct. 10, 2006.

International Preliminary Report on Patentability, PCT/US2006/039779 in the name of California Institute of Technology filed on Oct. 10, 2006.

* cited by examiner

RECONFIGURABLE INTEGRATED CIRCUIT AND METHOD FOR INCREASING PERFORMANCE OF A RECONFIGURABLE INTEGRATED CIRCUIT

CROSS REFERENCE TO RELATED APPLICATIONS

This application claims the benefit of U.S. Provisional Application No. 60/725,252, filed on Oct. 11, 2005, and of U.S. Provisional Application No. 60/772,424, filed on Feb. 10, 2006, both of which are incorporated herein by reference in their entirety.

STATEMENT REGARDING FEDERALLY SPONSORED RESEARCH OR DEVELOPMENT

The present invention was made with support from the United States Government under Grant number N00014-04-1-0591 awarded by the Office of Naval Research, and Grant FA9550-05-1-0444 awarded by AFOSR. The United States Government has certain rights in the invention.

FIELD

The present invention relates to integrated circuits. More particularly, the present invention relates to reconfigurability for variation tolerance.

BACKGROUND

Today's integrated circuits are built assuming that every copy of an IC design is identical. This is true both of conventional fixed circuits (e.g. ASICs, Custom circuit designs) and of designs mapped using conventional design approaches to reconfigurable circuits (e.g. FPGAs, CPLDs, coarse-grained reconfigurable devices).

Once fabricated, complete ICs are tested for speed performance and they are binned based on the highest operating speed the IC can sustain across all test. Further, reconfigurable ICs are binned according to the speed they can obtain across all possible designs mapped to the part.

When feature sizes are measured in thousands of silicon atom lattice spacings (0.5 nm) or multiples of the visible light wavelengths (400-700 nm), atomic-scale edge-roughness and variation has little impact on overall device characteristics. Further, when the dopants per device are measured in the millions of dopants, law of large numbers effects guaranteed that the device-to-device variation in dopant concentration is only a tiny percentage of the total dopant level. As device feature size shrinks, there is no longer the luxury of operating at scales that are several orders of magnitude above the scale of individual atoms and dopants. As a result, variation in device size, shape, dopant count, and dopant placement will manifest as significant variations in device characteristics.

Traditionally, VLSI devices with identical fabrication geometry are thought to be identical when placed on a die. Consequently, fabricated large integrated circuits (ICs) that have millions to billions of devices are carefully optimized to reduce the critical paths, perhaps at the expense of making most paths near-critical. Traditional process variations make the devices on an IC slower, but it does so in a consistent way so that the a priori assignment of logical gates and functions to devices still extracts the best performance possible from the fabricated IC.

However, at the atomic scale, devices that nominally have the same fabrication geometry will end up with distinct fabricated geometries and hence distinct characteristics, most of which cannot be known until after the device has been fabricated. As parameter variance increases, traditional techniques using fixed circuits, or even fixed assignment of functions to circuits on configurable devices, will see a decrease in the yielded speed of the IC. The cycle time of the device is determined by the slowest devices that end up on the near critical paths. When ICs have billions of devices and millions of near critical paths, there are ample opportunities for the near critical paths to sample from the statistically slow paths on the IC.

These problems are further exacerbated by the increased susceptibility of small devices to lifetime changes. It follows, over the operational lifetime of the IC, device characteristics will vary. Many of these effects cause individual devices to become slower (e.g. hot carrier, Negative Bias Temperature Instability (NBTI), electromigration). Parameters will also change over the lifetime of devices. Individual atomic bonds may break or metal may migrate increasing the resistance of a device or wire.

Looking beyond lithographic fabrication, techniques are being proposed to build post-fabrication reconfigurable circuits using nanowires and molecular-scale switches. For example, FIGS. 1 and 2 depict an architecture suitable for bottom-up construction from nanowires as described by Andre' DeHon in "Nanowire-Based Programmable Architectures," JETC, vol. 1, no. 2, pages 109-162, incorporated herein by reference in its entirety. Other nanoscale designs include the nanoFabrics described by Seth Copen Goldstein and Mihai Budiu in "NanoFabrics: Spatial Computing Using Molecular Electronics," ISCA, pages 178-189, date June of 2001, incorporated herein by reference in its entirety; CMOL described by Dmitri B. Strukov and Konstantin K. Likahrev in "A Reconfigurable Architecture for Hybrid CMOS/Nanodevice Circuits," ISFPGA, pages 131-140, year 2006, incorporated herein by reference in its entirety, and described in "A Reconfigurable Architecture for Hybrid Digital Circuits with Two-Terminal Nanodevices," Nanotechnology, vol. 16, no. 6, pages 888-900, date June of 2005, incorporated herein by reference in its entirety; and the crossbar architectures described by Greg Snider and Philip Kuekes and R. Stanley Williams in "CMOS-like Logic in Defective, Nanoscale Crossbars," Nanotechnology, vol. 15, pages 881-891, date June of 2004, incorporated herein by reference in its entirety, and described by Yi Luo and Patrick Collier and Jan O. Jeppesen and Kent A Nielsen and Erica Delonno and Greg Ho and Julie Perkins and Hsian-Rong Tseng and Tohru Yamamoto and J. Fraser Stoddart and James R. Heath in "Two-Dimensional Molecular Electronics Circuits," Chem Phys Chem, vol. 3, no. 6, pages 519-525, year 2002, incorporated herein by reference in its entirety. However, some believe the high variation in parameters in these nanoscale devices might make it impractical to exploit them as opined by Victor A. Sverdlov and Thomas J. Walls and Konstantin K. Likharev in "Nanoscale Silicon MOSFETs: A Theoretical Study," IEEE Transactions on Electron Devices, vol. 50, no. 9, pages 1926-1933, date September of 2003, incorporated herein by reference in its entirety.

At the same time, several techniques known in the literature provide a way to measure the delays or parameters of fabricated devices. For example, ring oscillators built from the resources on an FPGA provide one way to measure the delay of both regions and individual resources. Ring oscillators built out of nominally identical resources and placed on different locations of the chip can be used to determine the relative performance of each region of the chip. Individual resources (e.g. nominally identical wire tracks in a channel or LUTs in a Cluster) can be substituted within a ring oscillator to measure the relative delay impact of individual, substitutable resources.

For synchronous and precharge designs for example, a timing experiment may be setup to double dock the design at a reference frequency. This determines if a particular logic event can be successfully completed in a particular time window. By sweeping the timing of the reference frequency, the delay of the configuration may be identified. By configuring different active resources into the sample path, the delay supported by each resource or resource set may be mapped out. The Razor latch design uses a shadow latch to sample the signal a set period after the operating clock to detect late arriving inputs; such a design can be used both for characterization and for continuous monitoring during operation. This is described in more detail by Todd Austin and David Blaauw and Trevor Mudge and Kriszti'an Flautner in "Making Typical Silicon Matter with Razor," IEEE Computer, vol. 37, no. 3, pages 57-65, date March of 2004, incorporated herein by reference in its entirety.

Additionally, delay measurements may be preformed by configuring a portion of the IC to contain a test circuit that has one or more of the physical resources to be tested preceded and followed by registers in the IC. An input vector that will force a change to propagate through the resource(s) under test is applied. The input register is then docked so the change can begin propagating and the result is clocked into the output register. The clock on the input and output register can be the same or independent. In any case, by varying the delay between the input clock and the output clock, it is possible to determine the speed of the resources configured between the registers. If the output sees the correct value for the test, then there was enough time for the change to propagate through the resources. However, if the output sees the incorrect value, there was not enough time. Consequently, by adjusting the delay (perhaps the clock period) it is possible to determine the speed of the resources under test.

To measure the relative delay of regions, sample registers on a common clock can, for example, be configured along a chain of logic; faster regions will allow further propagation within the chain in a fixed cycle, while slower regions will propagate changes a shorter distance in the same fixed cycle.

FPGAs and CPLDs are often considered "fine-grained" because they use very fine-grained building blocks (small Lookup Tables (LUTs), small gates, primitive AND terms (pterms)). They also work on single-bit inputs and produce single-bit outputs. A term "coarse-grained configurable device" is often used to refer to configurable devices which use larger building blocks, often with multi-bit inputs and multi-bit outputs. Example include: MATRIX, PADDI, RaPiD, PipeRench. See for example, Ethan Mirsky and Andre' DeHon "MATRIX: A Reconfigurable Computing Device with Configurable Instruction Distribution and Deployable Resources," Hot Chips Symposium 1997, incorporated herein by reference in its entirety; Ethan Mirsky and Andre' DeHon "MATRIX: A Reconfigurable Computing Architecture with Configurable Instruction Distribution and Deployable Resources," ISFCCM, April of 1996, incorporated herein by reference in its entirety; Dev C. Chen and Jan M. Rabaey "A Reconfigurable Multiprocessor IC for Rapid Prototyping of Algorithmic-Specific High-Speed DSP Data Paths," IEEE Journal of Solid-State Circuits, vol. 27, no. 12, pages 1895-1904, December of 1992, incorporated herein by reference in its entirety; Alfred K. Yeung and Jan M. Rabaey "A 2.4-GOPS Data-Drivern Reconfigurable Multiprocessor IC for DSP," Proceedings of the 1995 IEEE International Solid-State Circuits Conference, pages 108-109, February of 1995, incorporated herein by reference in its entirety; Carl Ebeling, Darren Cronquist and Paul Franklin "RaPiD—Reconfigurable Pipelined Datapath," FPL, no. 1142, pages 126-135, September of 1996, incorporated herein by reference in its entirety; and Seth C. Goldstein, Herman Schmit, Matthew Moe, Mihai Budiu, Srihari Cadambi, R. Reed Taylor and Ronald Laufer "PipeRench: a Coprocessor for Streaming Multimedia Acceleration," ISCA, pages 28-39, May of 1999, incorporated herein by reference in its entirety.

Asynchronous Circuits

Asynchronous circuits are those which do not use a clock. They are naturally delay independent. As such, they can maintain correct operation even when devices or slow or devices slow down due to aging. However, there is no guarantee on the timing between events in an asynchronous circuit, and variation and aging can result in slow operation of the asynchronous device.

Asynchronous FPGAs are known in the art:

An Architecture for Asynchronous FPGAs. Catherine G. Wong, Alain J. Martin, and Peter Thomas. *Proc. IEEE International Conference on Field-Programmable Technology (FPT)*, December 2003, incorporated herein by reference in its entirety.

John Teifel and Rajit Manohar. An Asynchronous Dataflow FPGA Architecture. *IEEE Transactions on Computers* (special issue), November 2004, incorporated herein by reference in its entirety.

John Teifel and Rajit Manohar. Highly Pipelined Asynchronous FPGAs. 12*th ACM International Symposium on Field-Programmable Gate Arrays*, Monterey, Calif., February 2004, incorporated herein by reference in its entirety.

They key observation here is that the delay around a handshaking loop (request, action, acknowledge) is effected by the delay of the individual devices in the loop. Further, the throughput of an asynchronous pipeline or larger asynchronous cycle of dependencies will be determined by the slowest such handshake loop delay. In this manner, the slowest asynchronous handshake loop serves the same role as the slowest path in a synchronous circuit, limiting the performance of the entire circuit. The correspondence is not exact because the synchronous circuit demands that the clock cycle accommodate all possible data-dependent delays, whereas the asynchronous circuit can run as fast as a particular input data allows. Nonetheless, the broad phenomenon still applies.

A common asynchronous circuit is an arbiter. An Exemplary arbiter is disclosed in "A Delay-insensitive Fair Arbiter" by Alain J. Martin. June 1985, incorporated herein by reference in its entirety.

Unfortunately the existing techniques do not address fabrication or lifetime variation of devices. For example, existing techniques use mappings that do not account for the speed of individual devices; integrated circuits (ICs) build according to the existing design styles are crippled by the slowest devices, and existing designs techniques deliberately run devices slower than potential capacity to accommodate slowdown over device lifetime. Therefore, there is a need for a better approach to avoid the detrimental effect of device variation as VLSI feature sizes continue to shrink toward the atomic scale.

SUMMARY

According to a first embodiment, a method for increasing yielded performance of a reconfigurable integrated circuit (IC) comprising elements is disclosed, the method comprising: selecting a reconfigurable IC; measuring a delay characteristic the elements; mapping a target application to the reconfigurable IC based on the delay characteristics; and programming the reconfigurable IC based on the mapping of the target application.

According to a second embodiment, a method for improving performance of an application running on a reconfigurable integrated circuit (IC) is disclosed, the method comprising: mapping the application to the reconfigurable IC; generating circuitry to monitor performance of the application; identifying a portion of the reconfigurable IC that limits the performance of the application; remapping the portion of the reconfigurable IC to improve the performance of the application.

According to a third embodiment, a method for reducing degradation of an integrated circuit (IC) over time is disclosed, the method comprising: selecting a reconfigurable IC; mapping an application to the reconfigurable IC; monitoring at least one predetermined parameter of the application during operation; stopping operation when the at least one predetermined parameter fails to meet predetermined criteria; and remapping the application to the reconfigurable IC.

According to a fourth embodiment, a method for maintaining performance of an integrated circuit (IC) time is disclosed, the method comprising: selecting a reconfigurable IC; mapping an application to the reconfigurable IC; reserving spare resources on the IC; monitoring at least one predetermined parameter of the application during operation; stopping operation when the at least one predetermined parameter fails to meet predetermined criteria; and remapping the application to the reconfigurable IC using the spare resources.

According to a fifth embodiment, a computer system is disclosed, the computer system comprising: a memory to store computer-readable code; and a processor operatively coupled to said memory and configured to implement said computer-readable code, said computer-readable code configured to: access a delay characteristic of elements in a reconfigurable IC; map a target application to the reconfigurable IC based on the delay characteristics; and program the reconfigurable IC based on the mapping of the target application.

According to a sixth embodiment, a program storage device readable by a machine is disclosed, the program storage device tangibly embodying a program of instructions executable by the machine to perform method for increasing yielded performance of a reconfigurable integrated circuit (IC) comprising elements, said method comprising: accessing a delay characteristic of elements in a reconfigurable IC; mapping a target application to the reconfigurable IC based on the delay characteristics; and programming the reconfigurable IC based on the mapping of the target application.

According to a seventh embodiment, a computer system is disclosed, the computer system comprising: a memory to store computer-readable code; and a processor operatively coupled to said memory and configured to implement said computer-readable code, said computer-readable code configured to: map an application to a reconfigurable IC; generate circuitry to monitor performance of the application; identify a portion of the reconfigurable IC that limits the performance of the application; and remapping the portion of the reconfigurable IC to improve the performance of the application.

According to an eight embodiment, a program storage device readable by a machine is disclosed, the program storage device tangibly embodying a program of instructions executable by the machine to perform method for improving performance of an application running on a reconfigurable integrated circuit (IC), said method comprising: mapping the application to the reconfigurable IC; generating circuitry to monitor performance of the application; identifying a portion of the reconfigurable IC that limits the performance of the application; and remapping the portion of the reconfigurable IC to improve the performance of the application.

According to a ninth embodiment, a computer system is disclosed, the computer system comprising: a memory to store computer-readable code; and a processor operatively coupled to said memory and configured to implement said computer-readable code, said computer-readable code configured to: map an application to a reconfigurable IC; monitor at least one predetermined parameter of the application during operation; stop operation when the at least one predetermined parameter fails to meet predetermined criteria; and remap the application to the reconfigurable IC.

According to a tenth embodiment, a program storage device readable by a machine is disclosed, the program storage device tangibly embodying a program of instructions executable by the machine to perform method for reducing degradation of an integrated circuit (IC) over time, said method comprising: mapping an application to the reconfigurable IC; monitoring at least one predetermined parameter of the application during operation; stopping operation when the at least one predetermined parameter fails to meet predetermined criteria; and remapping the application to the reconfigurable IC.

According to an eleventh embodiment, a computer system is disclosed, the computer system comprising: a memory to store computer-readable code; and a processor operatively coupled to said memory and configured to implement said computer-readable code, said computer-readable code configured to: map an application to a reconfigurable IC; reserve spare resources on the IC; monitor at least one predetermined parameter of the application during operation; stop operation when the at least one predetermined parameter fails to meet predetermined criteria; and remap the application to the reconfigurable IC using the spare resources.

According to a twelfth embodiment, a program storage device readable by a machine is disclosed, the program storage device tangibly embodying a program of instructions executable by the machine to perform method for maintaining performance of an integrated circuit (IC) time, said method comprising: mapping an application to a reconfigurable IC; reserving spare resources on the IC; monitoring at least one predetermined parameter of the application during operation; stopping operation when the at least one predetermined parameter fails to meet predetermined criteria; and remapping the application to the reconfigurable IC using the spare resources.

According to a thirteenth embodiment, reconfigurable integrated circuit is disclosed, the reconfigurable integrated circuit comprises: a reconfigurable fabric; one or more memories; and a processor operatively coupled to the reconfigurable fabric and the memory; wherein the reconfigurable fabric is adapted to signal the processor when a predetermined events occur and stall operation, wherein the processor is adapted to access delay characteristics of the reconfigurable fabric, wherein the processor is adapted to map a target application to the reconfigurable fabric based on the delay characteristics, and wherein the processor is adapted to program the reconfigurable fabric based on the mapping of the target application.

According to a fourteenth embodiment, reconfigurable integrated circuit is disclosed, the reconfigurable integrated circuit comprises: a reconfigurable fabric; one or more memories; and a processor operatively coupled to the reconfigurable fabric and the memory; wherein the reconfigurable fabric is adapted to signal the processor when a predetermined event occurs and stall operation, wherein the processor is adapted to access delay characteristics of the reconfigurable fabric, wherein the processor is adapted to monitor execution of an application on the reconfigurable fabric; wherein the processor is adapted to remap at least a portion of a target application on the reconfigurable fabric based on the delay characteristics, and wherein the processor is adapted to program the reconfigurable fabric based on the mapping of the target application.

Additional embodiments are discussed in the claims and throughout the application.

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

Figure 3:
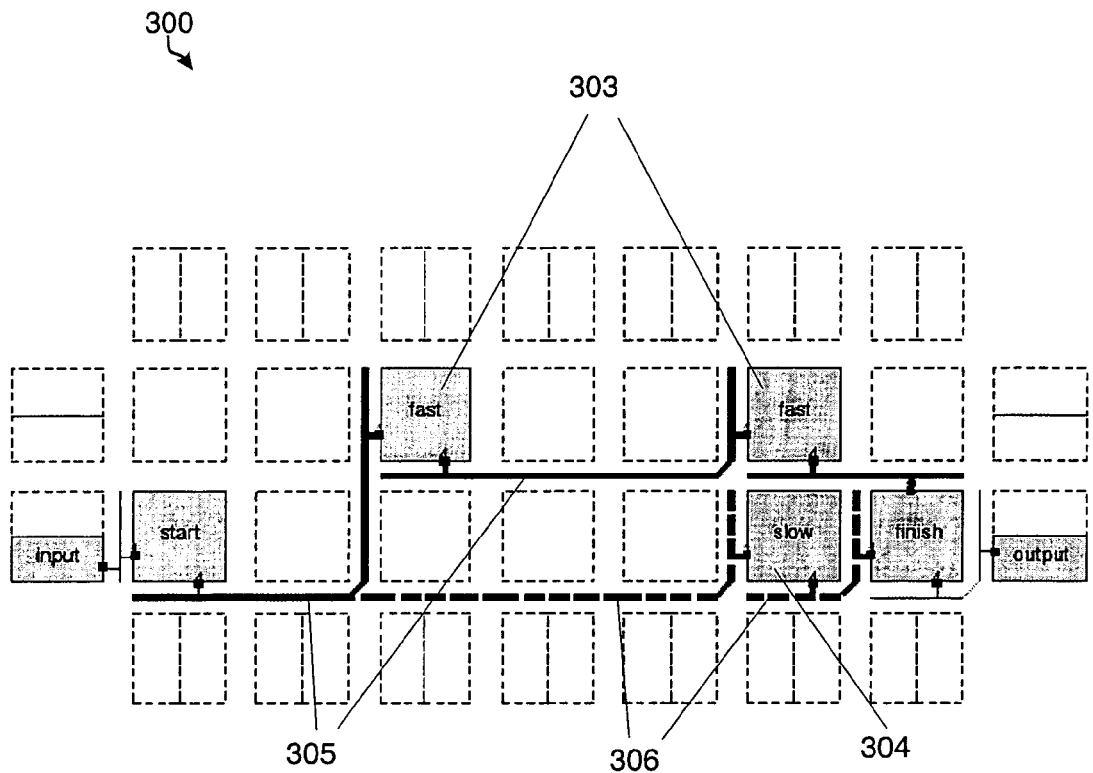
FIG. 3 depicts a circuit where logic elements disposed in the critical path are placed on fast resources while off-critical path logic elements are placed on slower resources.

As VLSI feature sizes continue to shrink toward the atomic scale, there will be increasingly significant variation in component parameters (e.g. threshold voltages, resistances, capacitances) within a single die. Unmitigated, ASIC and FPGA cycle times will be limited by the slowest devices resulting in degraded performance which reduces the expected speed benefits from feature size reduction. FPGA configurability provides an opportunity to compensate for this high variation. By exploiting knowledge of the delays in a specific device, it may be possible to compensate for the variation during mapping, thereby avoiding resources which are unreasonably slow, and strategically using faster resources on critical paths and slower resources on non-critical paths as shown in FIG. 3 and descried in detail below. These knowledge-mapped designs can even achieve delay improvements relative to variation-free fabrication. The impact of variation on achievable delay can be reduced for both conventional reconfigurable circuits (e.g. FPGAs and CPLDs) and emerging, nanoscale technologies (e.g. nanoPLA, CMOL, nanoFabrics) by employing variation-aware mappings techniques.

Conventional lithography sees two classes of within-die variation:

1. Region based—variation effects are localized to regions smaller than the die but larger than an individual device; examples include: CMP dishing, oxide thickness, lens aberrations; and
2. Random—variation effects are independent from device to device; examples include: statistical dopant variation and dopant placement, line-edge roughness, channel length.

Region-based variation suggest the need for variation-aware placement that avoids slow regions or carefully allocates critical path elements to fast regions. Random variations may potentially be accommodated with local perturbations in resource assignment (e.g. assignment of LUTs in a CLB, assignment of wires in a track). Statistically, it may still be possible to get a few channels or CLBs that have mostly slow, or mostly fast, parts suggesting placement can also be important when accommodating random variation sources, as well.

Systematic variations on the other hand, may cause identical geometries to have different characteristics from point-to-point on the die, but the devices vary in a repeatable manner from die to die and are potentially predictable. Actual prediction may, nonetheless, be beyond the level of simulation practically feasible. Examples include: proximity effects from phase-shift masking and optical proximity correction (OPC) used to image sub-wavelength feature sizes, $V_{dd}$ IR drops, and local self-heating. Some of these are reproducible and can, in principle, be addressed without variation-aware techniques (e.g. OPC effects)—either by simulating to account and compensate for the variation in an ASIC, or by tuning the FPGA CAD tools to account for this consistent component variation across devices. The tuned FPGA tools that reflect the actual delay of each device, will, nonetheless, be similar to the ones described in the present disclosure.

Figure 4:
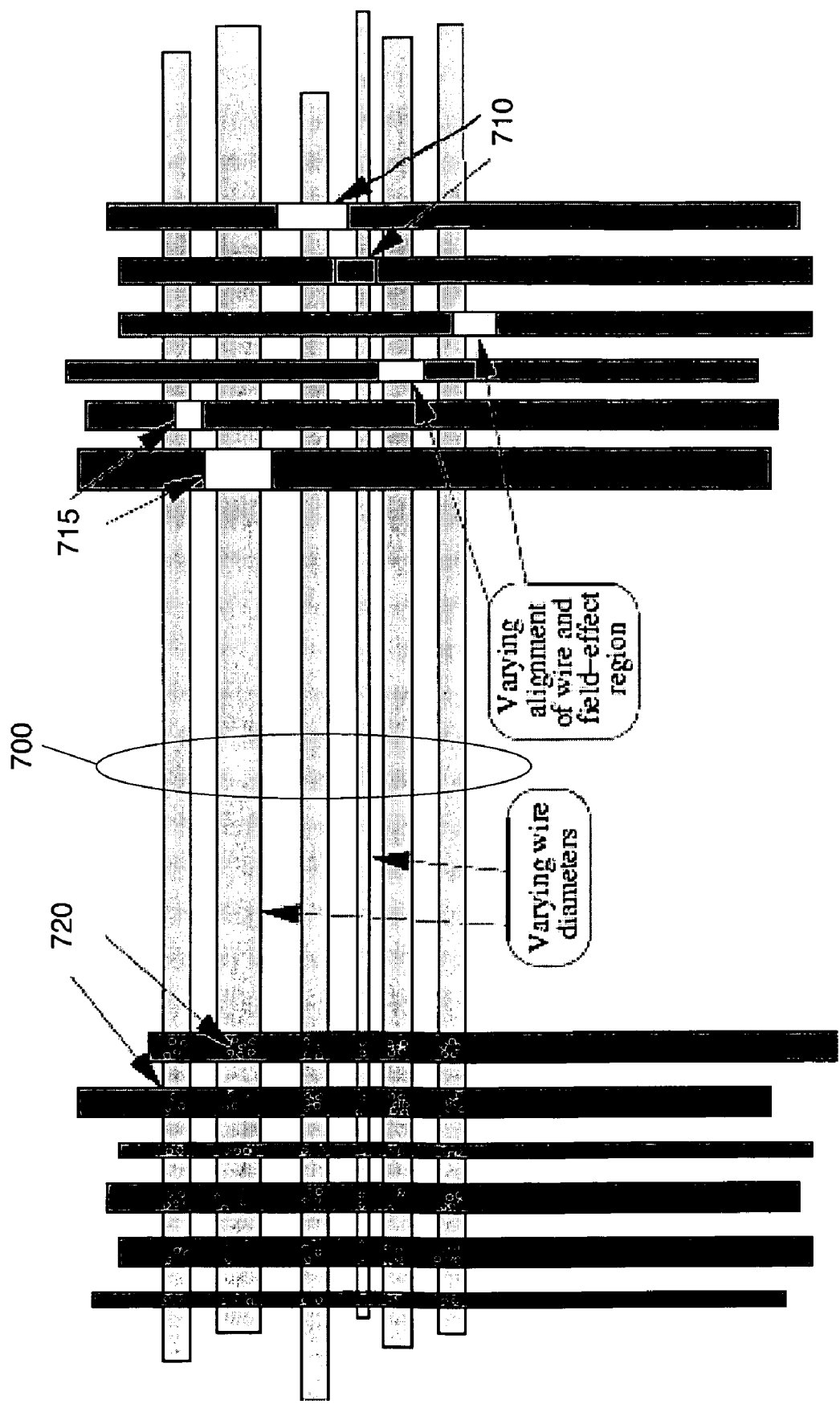
FIG. 4 depicts nanowires and molecular-scale switches having random variation and device characteristics.

Unlike conventional lithography, nanoscale reconfigurable devices built from individual nanowires and molecular-scale switches will have even more sources of random variation and will likely see larger variance in device characteristics as shown in FIG. 4.

Nanowires in some designs will be independently fabricated before assembly onto a substrate; as a result random variation in the resistivity and doping 710 of each nanowire 700 and each nanowire FET region will be obtained.

Nanowire 700 diameters and feature geometries (e.g. length of doped regions 715, core shell thickness) vary independently in a statistical manner.

Using statistical alignment techniques, the geometry of the field-effect regions varies from device to device.

Each programmable diode region will be composed of a small number of molecules 720 or bonds, giving them large, random variation from crosspoint to crosspoint.

According to one aspect of the present disclosure, yielded performance of an integrated circuit (IC) may be increased by measuring the characteristics of the individual devices in the IC, performing design mapping to those characteristics, producing a configuration for the specific reconfigurable IC.

To use any configurable IC, the application task to the reconfigurable circuit needs to be mapped. Conventionally, mapping tools characterize the delay of a circuit with a single, static model of the delay of all the components and connections in the circuit. This delay model may be used by all mapping phases, including: logic synthesis, covering, clustering, assignment, placement, and routing.

With high variations, no single, static map of the delays of the components of the IC is adequate. Instead, a database of the delays of the primitive elements in the IC needs to be created. Depending on the granularity of the configurable IC and the granularity with which the delays are recorded, this delay may be at an individual gate and wire level (including LUTs and Product Terms, i.e. Pterms), at a functional unit level (e.g. ALUs, Memory blocks), or at a larger system level (e.g. processor, router). The mapping tools are then adapted to work from this component-specific database.

A common mapping flow might involve logic synthesis to primitives, covering into local blocks (e.g. LUT Clusters, nanoPLA blocks), placement of clusters, routing between clusters, and assignment of lower-level primitives inside clusters. Since delay variation is based on the physical primitives, the largest opportunity for optimization exists in the physical mapping stages of placement, routing, and assignment.

Placement:

Conventional placement will try to minimize interconnect requirements and minimize delays. In a conventional placement, all compute resources (e.g. LUTs, ALUs) of the same type have the same speed. With variation, each compute resource may have a different speed. As a consequence, the variation-optimizing placer must account for both the delay of the individual resources and the communication delay between resources. The optimizer should penalize the placement of critical (low slack) resources on high delay compute elements that require high communication delay to their neighbors. Most common approaches to placement use virtual "energy" cost functions to drive optimization, including force-directed, simulated annealing, analytical placement, and conjugate gradient-based techniques. In conventional models, the regularity and assumed equivalence of delays makes the coefficients in these cost functions uniform. To tolerate independent delays, coefficients from the delay database are used and a cost function terms is added for resource costs previously assumed to be identical (e.g. LUT or ALU delay). This also means certain moves which might not have changed timing in a uniform-delay part will change timing in a high-variation part; for example, translating the location of a subcircuit would typically be assumed not to have a large impact on the delay of the subcircuit, but may have a large effect in the variation-aware case. FIG. 3 depicts an exemplary circuit 300 where logic elements disposed in the critical path are placed on fast resources 303 connected by fast wires 305, while off-critical path logic elements are placed on slower resources 304 connected by slower wires 306.

Figure 5:
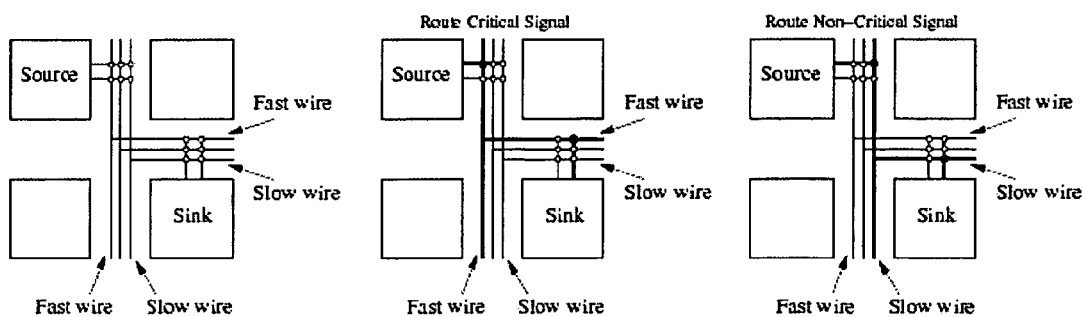
FIG. 5 depicts an exemplary case where interconnect resources which would normally be identical have different speeds.

Routing:

For FPGAs and configurable devices with limited population interconnect, prior-art routers are typically based around a variant of Pathfinder (including VPR used for Island-style FPGA interconnect). Pathfinder accommodates delay optimization by including a delay term for each resource. In conventional routers, the source of this delay term is typically a regular model of the delay of each resource, with each resource of the same type getting the same delay. The base Pathfinder algorithm may be adapted for the high-variation case, by replacing the uniform delay map with the database of delays for individual resources. FIG. 5 depicts an exemplary case where interconnect resources which would normally be identical have different speeds. With this change, Pathfinder may be run directly. However, it is useful to note that many of the performance optimizations traditionally applied to Pathfinder's shortest path search (including depth-first and A* search) depend on the uniformity of interconnect delays. Consequently, these optimizations, if applied blindly, can be misleading and will not find the shortest routes in the device.

The VPR router from Toronto may also be modified to interface with a component-specific delay database to perform routing for high-variation FPGAs. With care to avoid the optimizations options that are no longer valid (mentioned above), the modified VPR may be used with a delay database and achieve higher performance than the conventional approach. With a delay variation that has a 20% variance (sigma=20%*mean-value), there may be, for example, a 5-10% improvement in delay; and at 30% variance there may be, for example, 10-15% improvement.

Independent Function Assignment:

Within a PLA Block (or FPGA cluster, or any case where there is a set of interchangeable resources) the goal is to map a set of functions, to be computed, to physical resources (e.g. nanowires, physical Pterms, LUTs) within the block in order to implement the functions while minimizing their delay. By programming critical functions on to fast resources and programming non-critical functions on slower resources, as shown in FIG. 3, it may be possible to exploit the present variations. In order to accomplish this, a measure of the criticality of a function may be obtained by static timing analysis and the delay of individual resources within the block may be acquired using one of the measurement techniques described earlier and stored in the delay database for the algorithm. With the resources delays and the function criticality, functions can be mapped to resources. The goal is to assign the most critical function to the fastest resource. In an independent block, an optimal assignment can be achieved by simply doing a greedy mapping between the two sets. Specifically, start with the set of functions to map and the set of physical resources to be assigned. Repeatedly picking the most critical function and assigning it to the fastest resources followed by the removal of that function and that resource from their respective unmapped sets.

Figure 6:
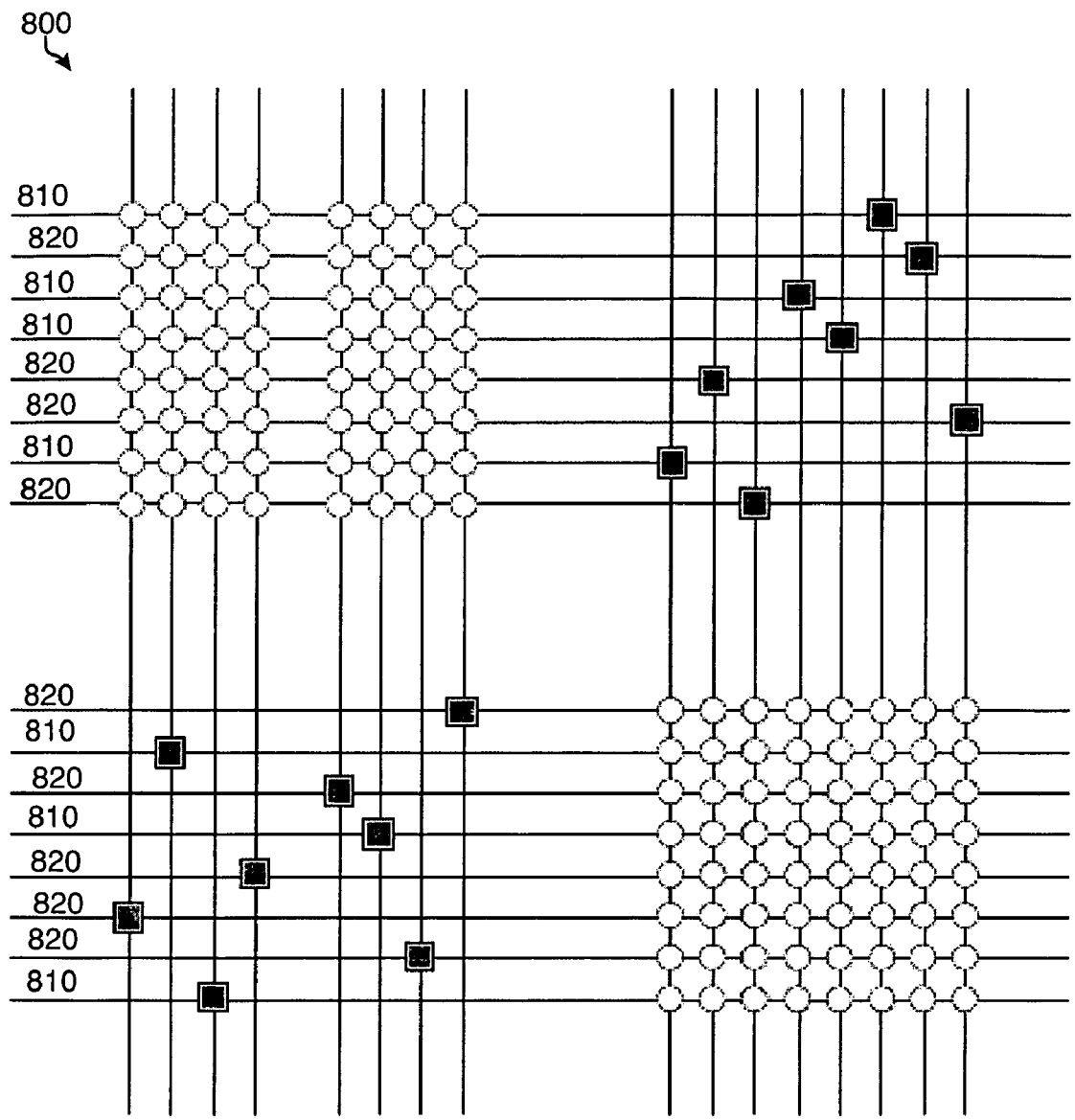
FIG. 6 depicts a nanoPLA block.

FIG. 6 depicts an exemplary case where nanoPLA block 800's resources, which would normally be identical, have different speeds due to variation effects. According to FIG. 6, nanoPLA block 800's nanowires 810 are fast nanowires while nanowires 820 are slow nanowires.

Figure 7:
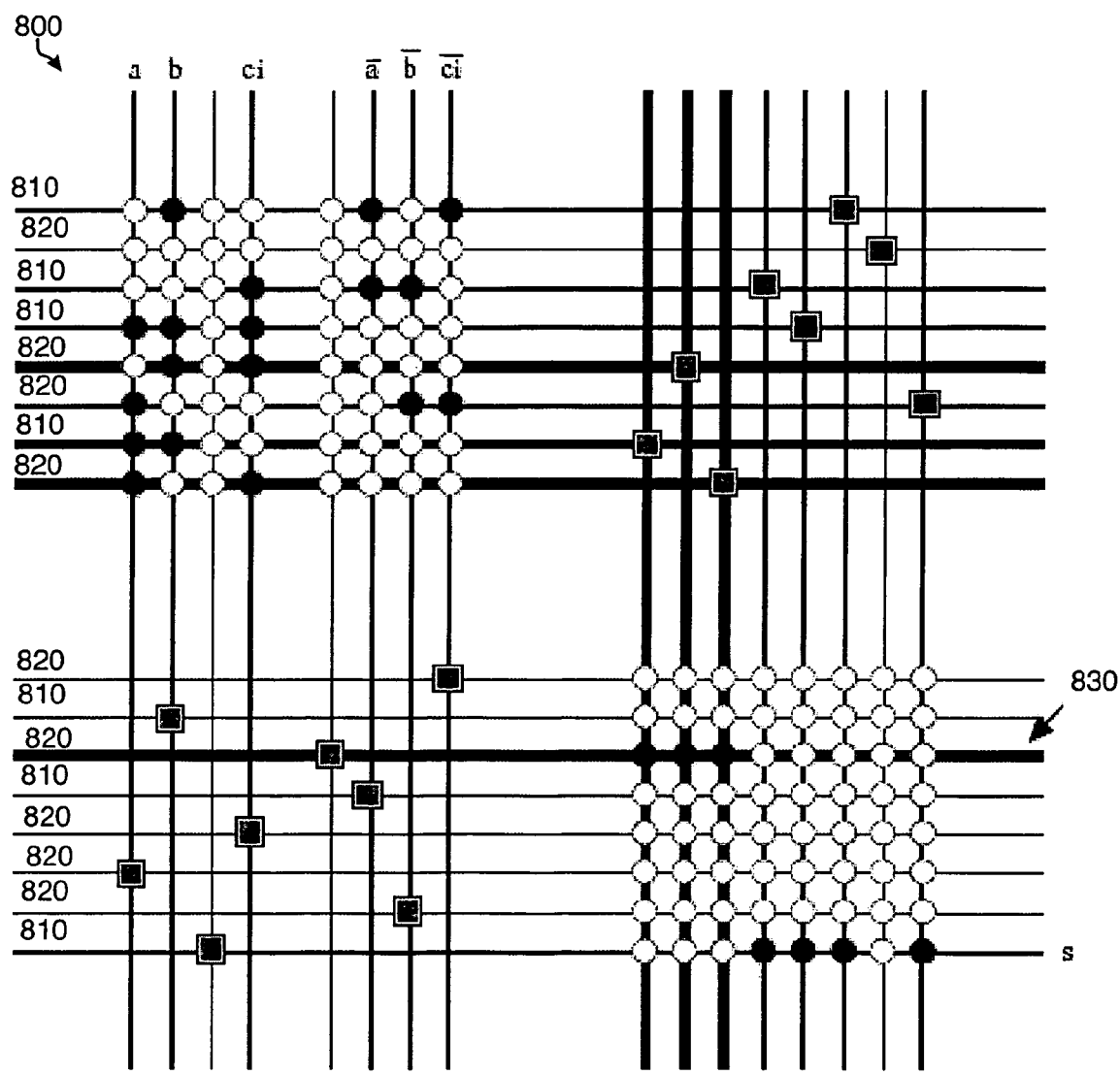
FIG. 7 depicts an oblivious mapping of a 1 bit adder.
Figure 8:
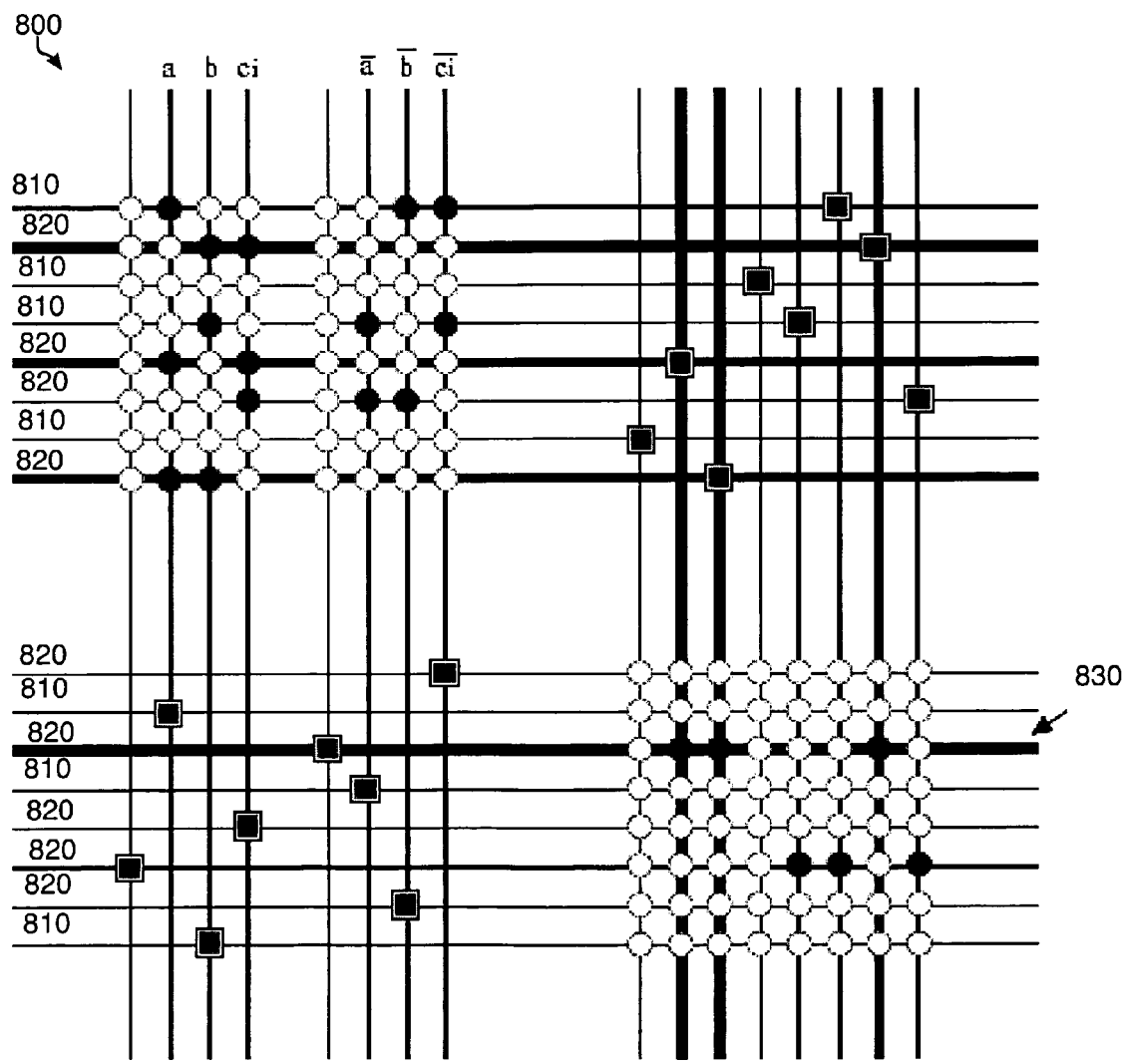
FIG. 8 depicts a worst case mapping of a 1 bit adder.
Figure 9:
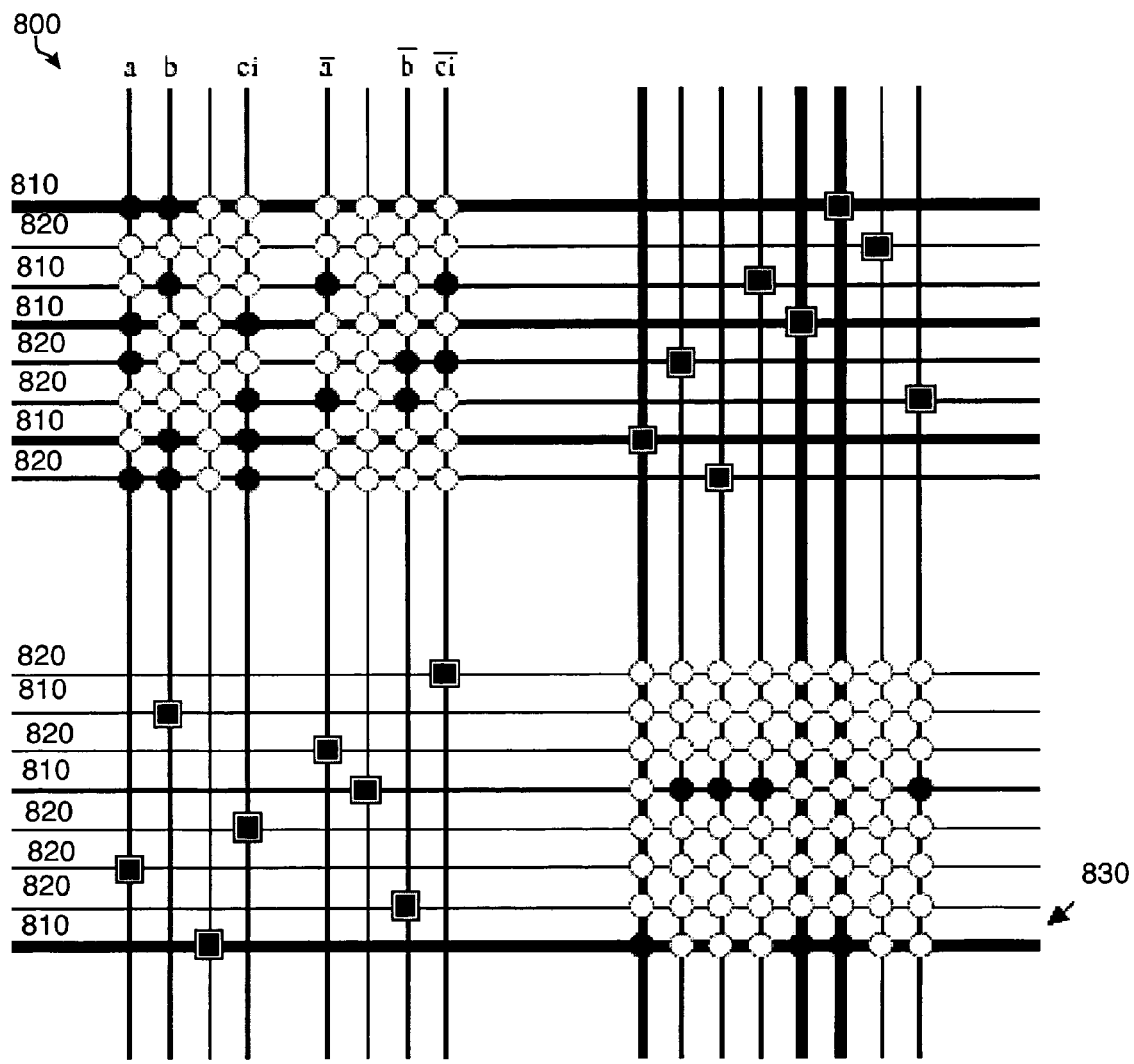
FIG. 9 depicts a best case mapping of a 1 bit adder.

In a ripple carry adder using nanoPLA block 800 a critical path is a carry bit. A mapping of one unit of a ripple carry adder using nanoPLA block 800 is displayed in FIGS. 7-9. FIGS. 7-9 depict how a critical path 830 changes based on how the variation present in a nanoPLA block 800 are used. FIG. 7 depicts an oblivious mapping of a 1 bit adder. Mapping according to FIG. 7 achieves a delay of about 4 on the critical path. FIG. 8 depicts the worst case mapping which archives a delay of about 4.8. FIG. 9 depicts how it may be possible to take advantage of the variation present in the nanoPLA block 800 to create a mapping that outperforms the mapping depicted in FIG. 16. Mapping according to FIG. 9 achieves a delay of about 1.2 that is 70% better than the mapping according to FIG. 7 and 75% better than the mapping according to FIG. 8.

For FET devices, variation often shows up in the threshold voltage, $V_t$. Dopant and line-edge roughness typically result in gaussian variations around the nominal threshold voltage. This can be turned back into a drive current according to the Equation 1, provided below:

$$I_{SAT} \propto (V_{GS} - V_t)^2 \quad \text{Equation 1}$$

which is inversely related to the drive resistance as shown by Equation 2, provided below:

$$R_{SAT} \propto \frac{1}{I_{SAT}} \quad \text{Equation 2}$$

The $V_{GS}$ in Equation 1 is the full distance between the input low voltage and the high supply ($V_{IL} - V_{DD}$) or between the input high voltage and the low supply ($V_{1H}$ assuming the low supply is ground). If $V_t$ is small compared to $V_{GS}$, then the variation will have modest effect on performance (e.g. a 350 mV threshold with a variation of $s\upsilon_t$=25 mV and a 2.5V supply); however if $V_t$ is comparable to $V_{GS}$, a large variation will significantly impact the performance or the device may not even work (e.g. a 350 mV threshold with a variation of $s\upsilon_t$=75 mV operating with $V_{GS}$=600 mV; at 3 $s\upsilon_t$, the drive of $(25 \text{ mV})^2$ is two orders of magnitude below the nominal drive of $(250 \text{ mV})^2$).

In practice, some wires, junctions, or resources will be unusable. For example, once $|V_t| > |V_{GS}|$, the devices cannot be turned "on". Even before this, the current may have such a low "on" current it cannot reliably be distinguished from a leaky device. Similarly, if $|V_t|$ is too small compared to $|V_{1H} - V_{DD}|$ or $V_{IL}$, it may not be possible to turn the device "off" sufficiently such that the resulting "off" current is adequately below the allowed, weak operating "on" currents. As a result, this assignment is integrated with the matching techniques described by Helia Naeimi and Andre' DeHon in "A Greedy Algorithm for Tolerating Defective Crosspoints in NanoPLA Design," ICFTP, IEEE, pages 49-56, date December of 2004, incorporated herein by reference in its entirety, and described in "Seven Strategies for Tolerating Highly Defective Fabrication," IEEEDT, vol 22, no. 4, pages 306-315, date July-August of 2005, incorporated herein by reference in its entirety. When assigning the most critical function to the fastest physical resources, the assignment is to the fastest physical resource that can actually support the function.

Figure 1:
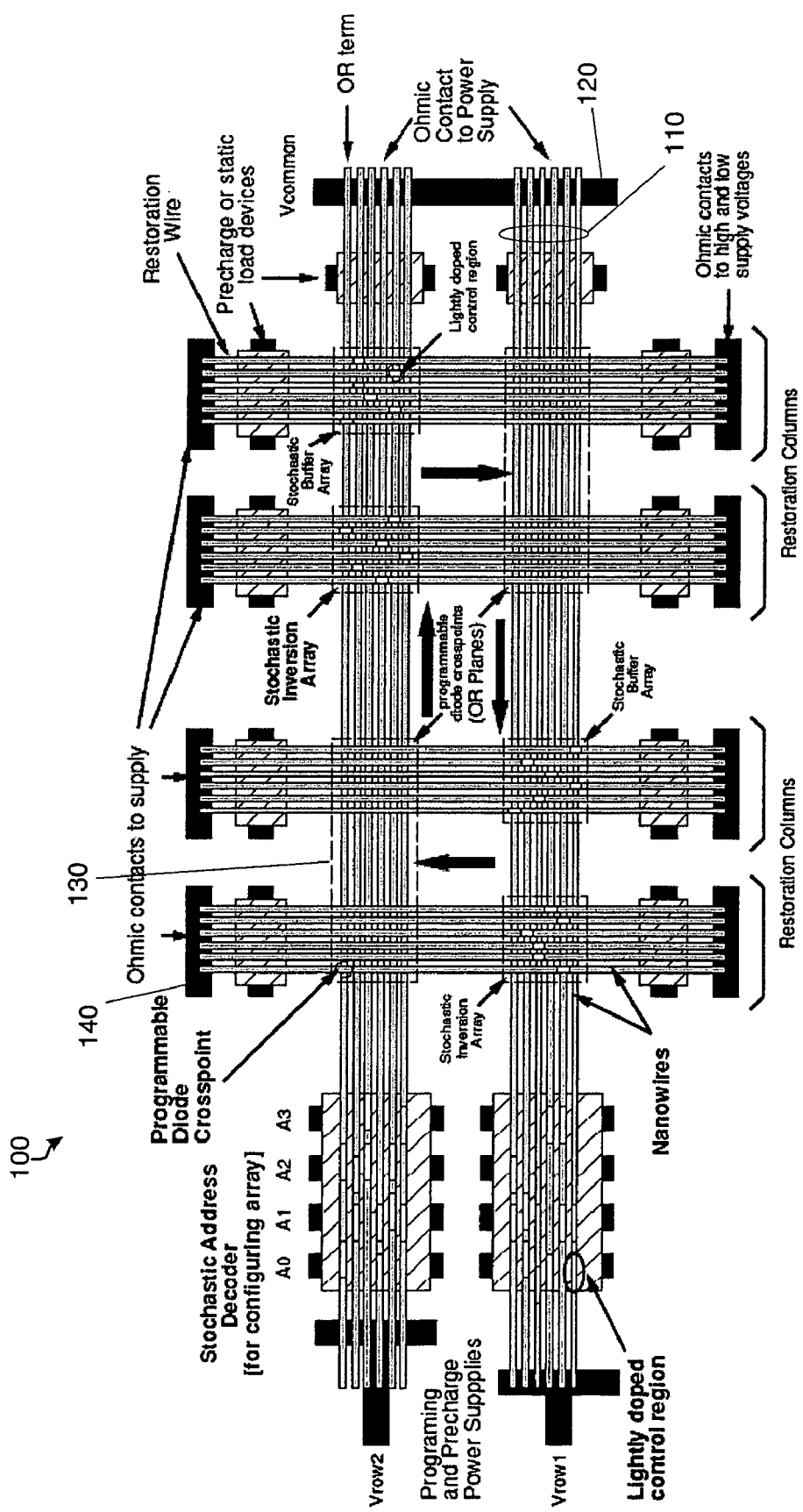
FIGS. 1 and 2 depict nanoPLA structures.
Figure 2:
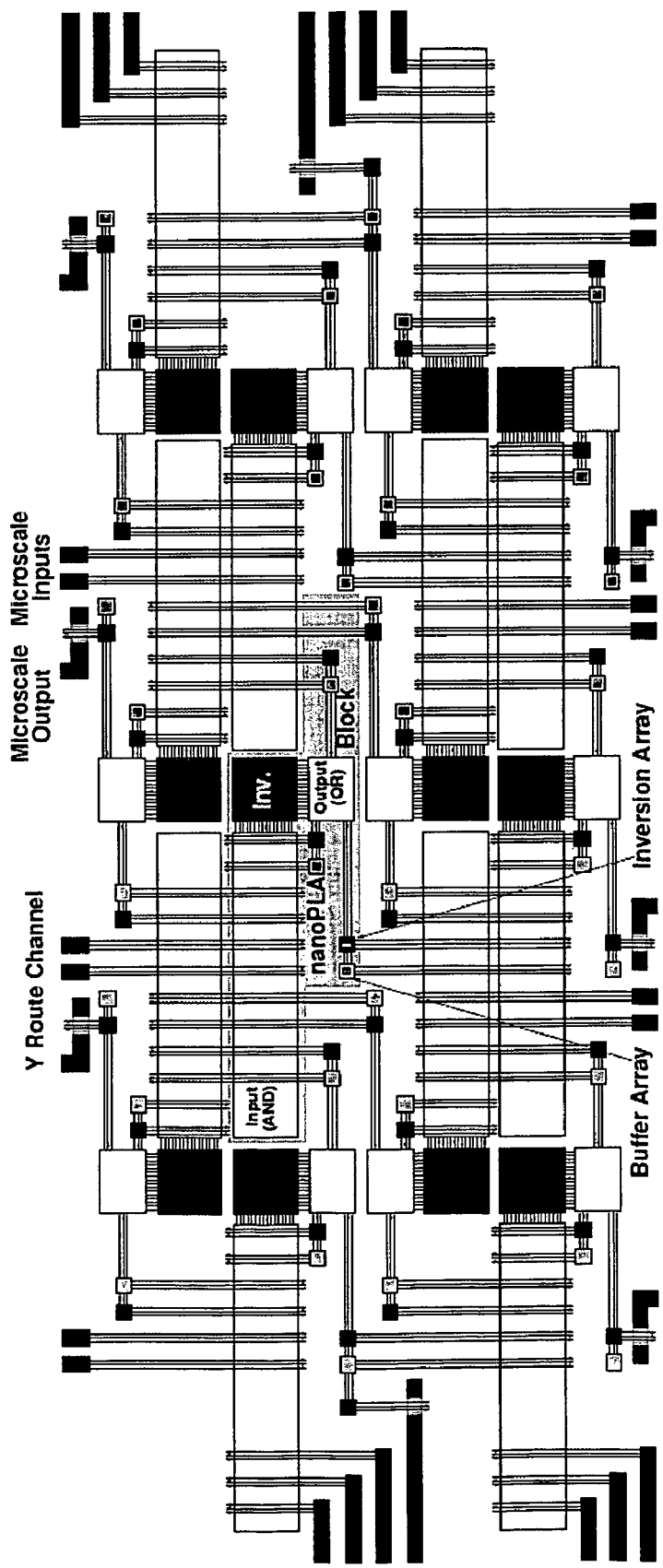

Referring to FIG. 1, the following approach may be used to measure the speed of devices in nanoPLA 100. By forming a voltage divider (not shown), for example, between the nanowires 110 and a common "ground" line resistance 120 connected to a known, lithographic-scale resistances, it is possible to measure the resistance of individual nanowires 110 under specific control voltages. Similarly, voltage dividers (not shown) disposed between programmed junctions 130 and a reference resistance 140 on the pullup can be used to estimate the resistance of "on" (or "off") crosspoint junctions 130.

Choice (Overpopulation)

To illustrate the kinds of benefits assignment can provide, the impact of over-provisioning resources is considered next. This may arise simply because all the physical resources in a cluster or block are not needed; or it may arise deliberately as an approach to reduce the effects of high variation. The worst-case path effects described above results when every resource is used. The entire circuit is forced to slow down because one or a few units are likely to be very slow. If the gates or segments of devices are Gaussian distributed, then half of them are faster than the mean and half are slower. If a device with twice the resources of those needed (e.g. twice the channel width, twice the LUTs per CLB) is available, it could be possible to avoid the half of the resources which are slower than the mean, and guarantee that most ICs run at least as fast as the mean delay. More generally and formally, if equivalent sets of resource of size N are available and they are mapped to only use M of them, then the probability of yielding the M resources is:

$$P_{map} = \sum_{M \leq i \leq N} \left( \binom{N}{i} (P_u(\tau_{ref}))^i (1 - P_u(\tau_{ref}))^{N-i} \right) \quad \text{Equation 3}$$

Here, $P_u$ is a guassian distribution for $\tau_u$, wherein:

$$P_u(\tau_{ref}) = P(\tau_u \leq \tau_{ref}) \quad \text{Equation 4}$$

Figure 10:
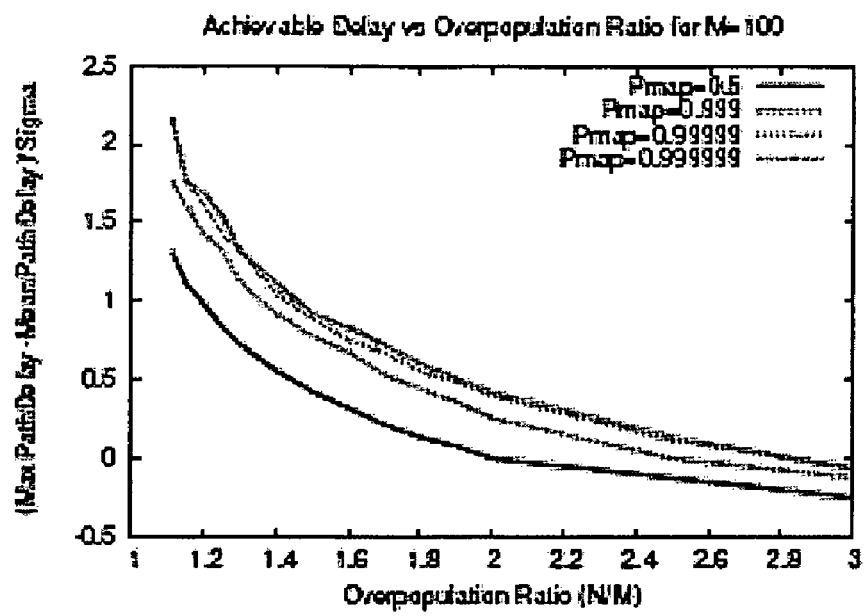
FIG. 10 plots an expected delay as a function of the over-population ratio.

For fixed M and N, it is possible to invert this and ask what $P_u$ results in a given level of $P_{map}$. In turn, this provides $t_{ref}$ that can be expected to achieve in order to meet the $P_u$ bound. Putting this together, FIG. 10 plots the expected delay as a function of the overpopulation ratio (N/M) for M=100; M=100 is a typical value for the number of PTERMS in a nanoPLA block.

As suggested above, this shows that 50% of the time, the nominal delay with an over population of 2 may be achieve. It further shows that delay below the nominal delay with greater overpopulation may also be achieved. Equation 12 assumes all units are on the critical path. The relations in Equation 12 and FIG. 10 highlight the trend that greater choice in mapping leads to lower expected circuit delays.

Furthermore, referring to FIGS. 11*a-e*, delay measurements may be preformed by placing a second latch, i.e. sample register 210, on the signal path 220 and use it to observe the value of a signal at some time other than the clock edge. This can be used to determine if a value always arrives earlier than the clock, and hence the circuit might be able to operate faster. By tuning the delay between the clock period and the sample pulse, determination can be made as to how much faster the input is from the actual clock period. It can also be used to see if a value changes after the clock edge as an indication of failure (the value arrived later than intended). Razor is a specific embodiment of this later idea.

Figure 11A:
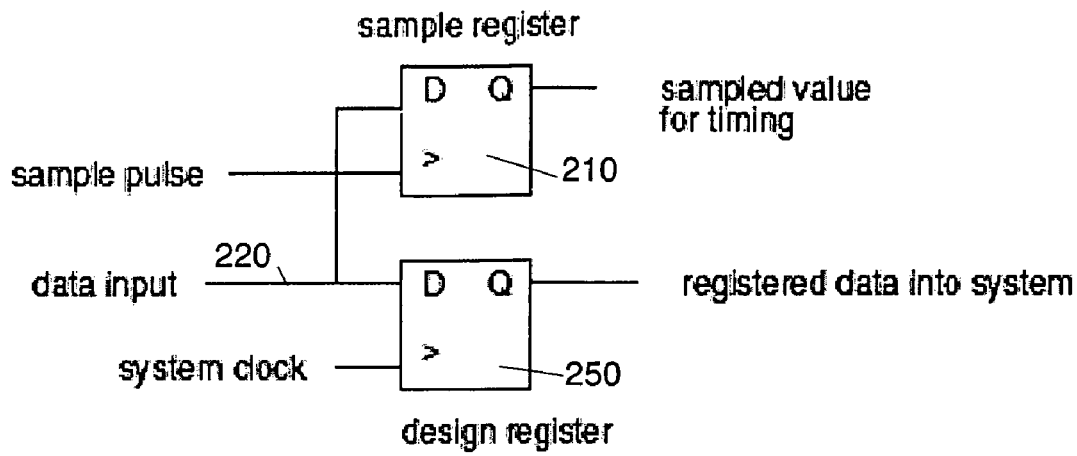
FIGS. 11a-e depict sample register to be used in delay measurements.
Figure 11B:
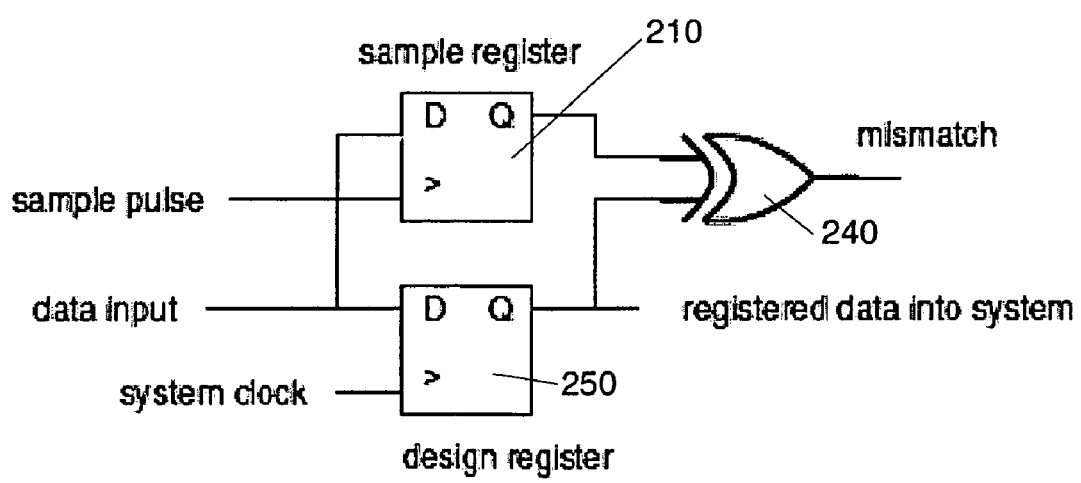
Figure 11C:
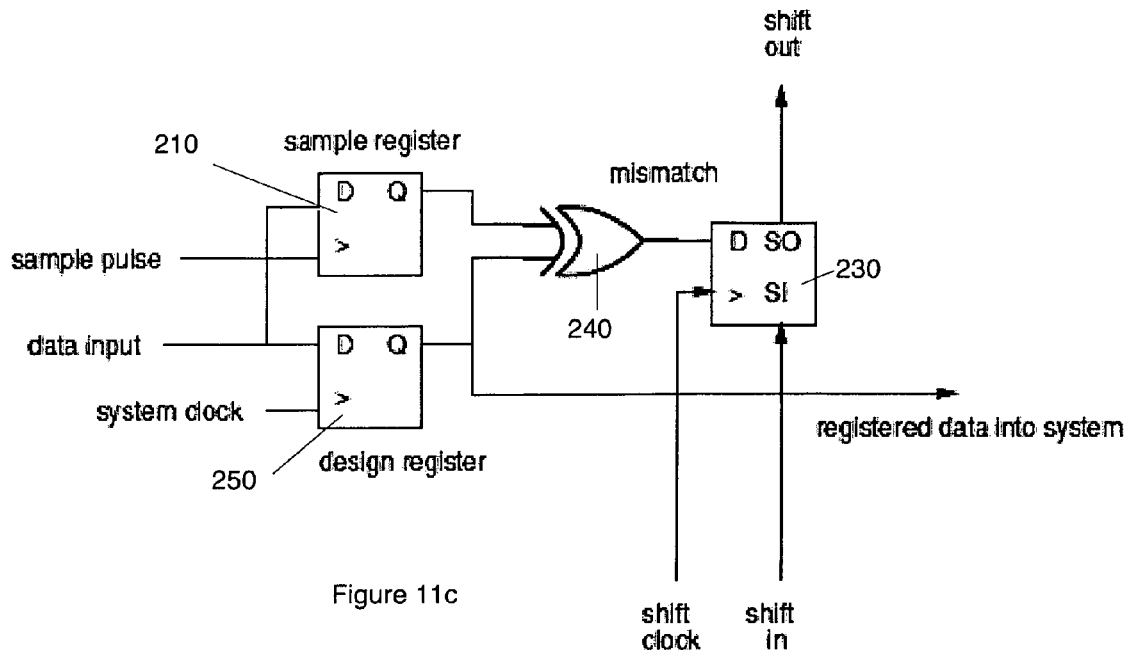
Figure 11D:
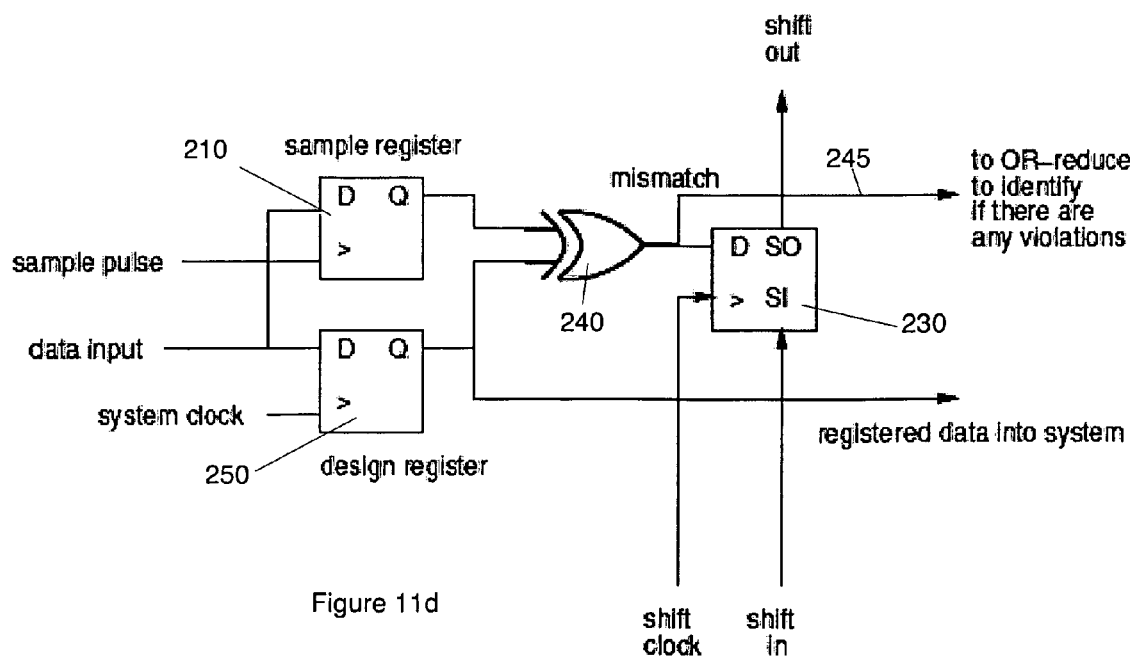
Figure 11E:
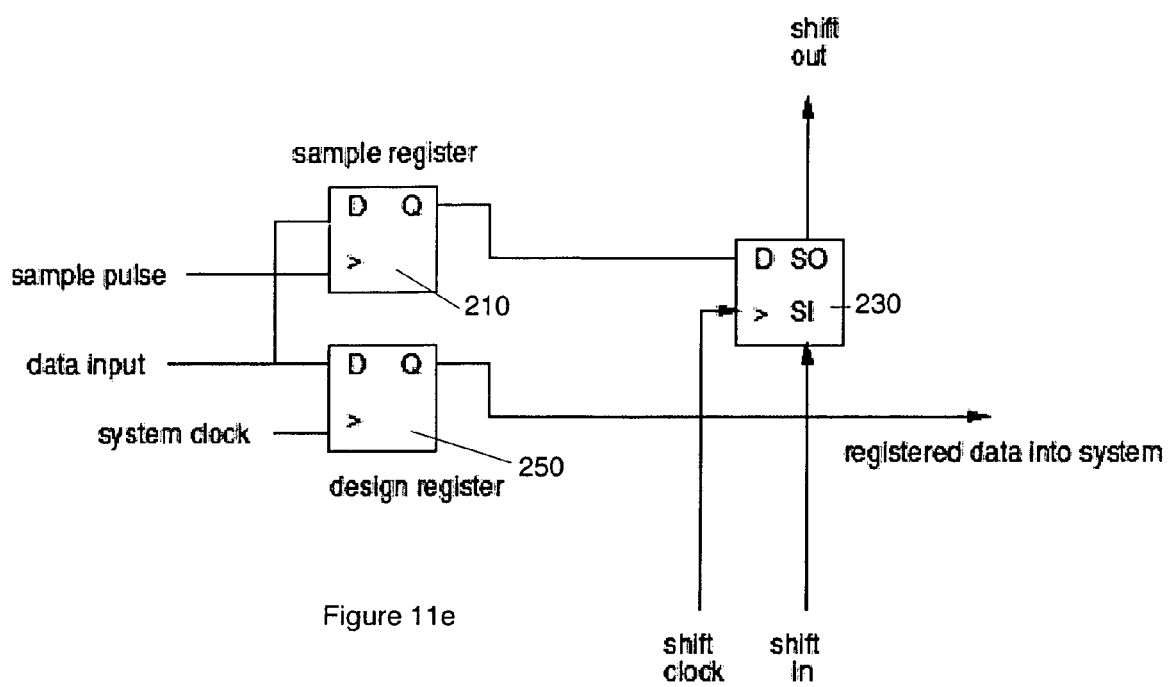

Because the sample register 210 may not fire on every clock cycle, it may be integrated with a shift chain register 230, as shown in FIGS. 11*c-e*, to require minimal additional wiring in the circuit. One skilled in the art will know that the sample register and the shift chain register can be combined.

Referring to FIGS. 11*b-d*, an XOR gate 240 may be adapted to compute differences between the sample register 210 and a main register 250. In some embodiments, depicted in FIGS. 11*c-d*, the output of the XOR gate 240 may be fed into the shift chain register 230. Because it may be useful to know when any mismatch occurs, output 245 of the XOR gate 240 can be routed to an OR-reduce network (not shown). This could trigger controls to stop the logic when the IC slows down over the lifetime of the IC. It could also be used to streamline testing, allowing a controller to avoid looking at the sample register when there are no differences detected. In a related use, it could be used to trigger capture of the differences into the shift out registers.

Simultaneous Function Assignment and Routing:

Although greedy mapping, described above, may be used to assign functions to an independent block to obtain an optimal mapping, blocks in many designs, including nanowire-based PLA, are not independent. Specifically, the output of one block feeds into the input of another block. Moreover, by fixing the input/output of a given block it is possible to fix some of the outputs/inputs of the blocks it communicates with thus limiting the function mappings available to those blocks. It is also worth noting that unlike conventional FPGAs, routing on the nanoPLA architecture is not separate from function computation. A methodology that produces a route and maps functions to resources simultaneously to deal with both of these constraints is suggested.

As in the independent block case, described above, the delays present in the physical component need to be measured. Again this is accomplished by one of the measurement techniques previously described. Also, an initial criticality for both the nets and the functions need to be computed. This may be done based on the logical structure of the circuit being mapped. Additionally, clustering and placement that assigns sets of functions to physical blocks is needed as well. With this information a two-phase algorithm may be implemented. The first phase performs a semi-global route by using a modified version of the Pathfinder algorithm. The second phase performs detailed function assignment within a block and routing between blocks.

Phase One

This phase runs the Pathfinder algorithm with a modified cost function. For each net, as it explores a resource, it computes a cost of using that resource based on the criticality of the net and the distribution of resource delays present in the block where the resource is located. Furthermore, the physical delay is augmented through the resource to include information about the physical delay of the resources to which it can connect, thereby accounting for the fact that blocks are not independent. The intent of the computed cost is to match the level of criticality of the net to the augmented delay measure of the resources so as to minimize the cost.

Phase Two

This phase iterates over all blocks and assigns functions and routes to physical resources to produce a detailed function assignment and route for the circuit. Since routing and function computation are done on the same block in architectures like the nanoPLA, in these cases routes that pass through each block can be modeled as a simple, single-input identity functions thus reducing everything to functions computed within a block. Once this is accomplished, the criticality of the functions and nets as well as the augmented delay (as described above) of the resources in the block are used in a similar manner to that described for function assignment on independent blocks. However, the input and the output dependencies for this block that come from the fact that blocks are not independent are also included. Once this information is compiled, a mapping (e.g. a greedy assignment as above, or with a more sophisticated matching algorithm) from functions to wires while maintaining any input or output constraints is performed.

Once phase two completes it is possible to recalculate the criticality of all functions and nets using the physical delays given by the mapping and iterate over both phases until the solution converges.

Integrated Composites

One way to do placement, routing, and assignment is to define individual sum-of-products as the moveable entities. Then, start with some assignment of the sum-of-products to physical pterms in physical blocks. An incremental improvement algorithm (like the ones for placement (e.g. greedy, force-directed, simulated annealing) may be used. For moves, these products are moved to different physical resources (e.g. different physical nanowires). By providing a complete ground mapping, routing, assignment, and placement are preformed together.

Precision:

In an ideal case, the delay of every resource would be known to infinite precision. However, in practice, the delay of each parameter is known to some limited precision because it would be too costly in area to accurately record result with high precision, too costly in time to accurately measure with high precision, and it may be necessary to estimate delay of component from delay of an ensemble. This will likely create many uncertainties of how the delay actually decomposes to the individual components Consequently, it is useful to note that reasonable benefits may be achieved with modest precision. For characterization purposes, the precision of knowledge may be characterized by the number of bits of precision that is obtained from measurement. By having one threshold and knowing that some devices are faster and that some devices are slower, the algorithm would be working with one (1) bit of precision. If they are bin into four (4) groups, that would yield two (2) bits of precision. The obtained results suggest the first few bits of precision produce the most benefit, with the marginal improvement in obtainable results for additional bits beyond the first 5-6 being low.

Figure 12:
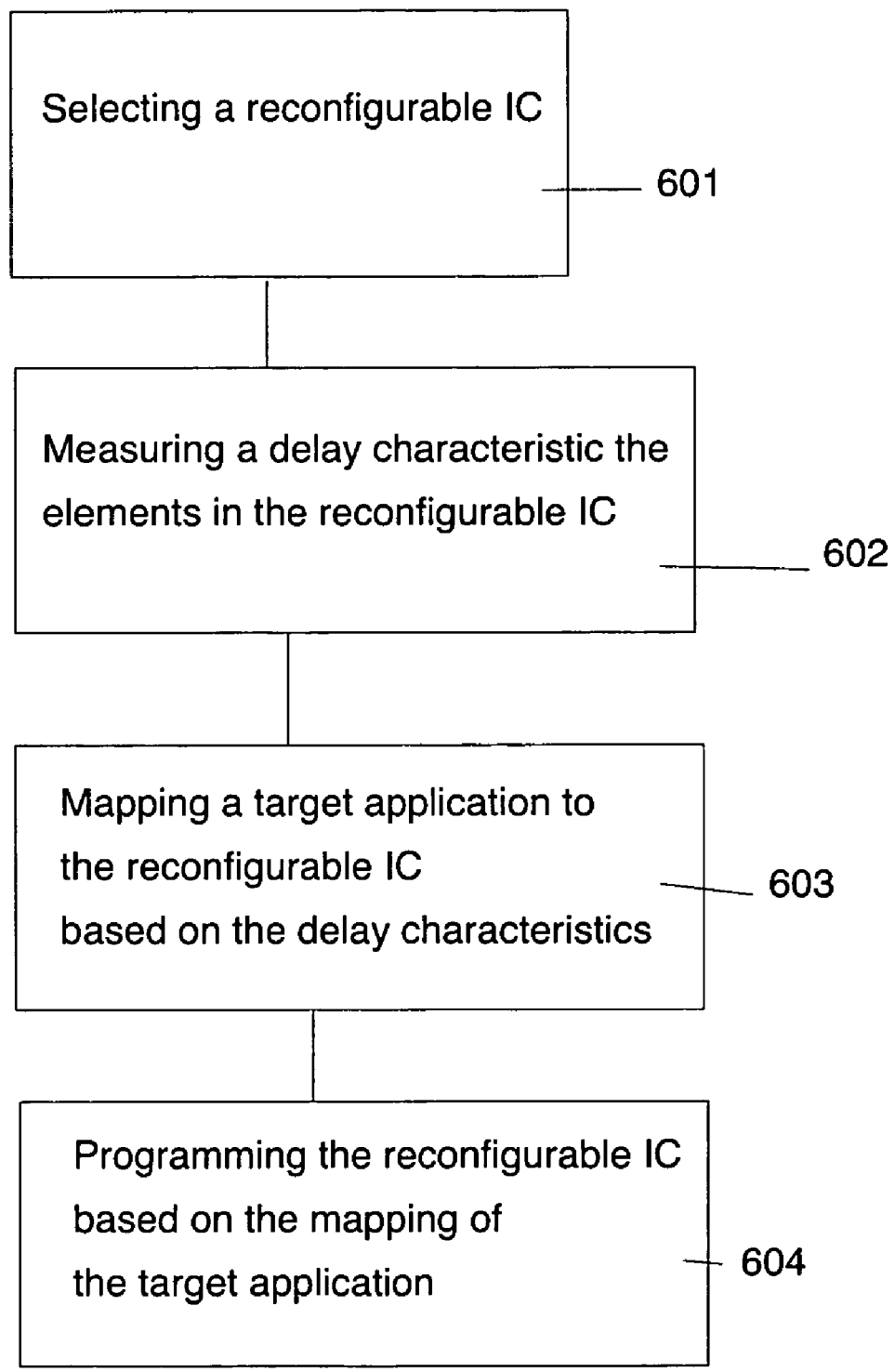
FIG. 12 depicts a method for increasing yielded performance of a reconfigurable integrated circuit (IC) comprising elements.

FIG. 12 depicts a method for increasing yielded performance of a reconfigurable integrated circuit (IC) comprising elements. According to FIG. 12, a reconfigurable IC is selected (601); a delay characteristic of the elements in the reconfigurable IC is measured (602); a target application is mapped to the reconfigurable IC based on the delay characteristics (603); and the reconfigurable IC based on the mapping of the target application is programmed (604).

According to a second aspect of the present disclosure, performance of an application running on a reconfigurable integrated circuit (IC) may be improved by using a reconfigurable device, monitoring the speed of a mapped application during operation, identifying the slowest portions of the circuit, locally remapping just the slow portion of the circuit.

Incremental Remapping:

While mapping based on the full delay knowledge is possible, there may be some situations where the full knowledge is difficult to obtain and where small perturbations in the mapping might offer significant speedups.

If a chip is clocked synchronously, the clock cycle is limited by the longest path in the chip. This provides Equation 5 below:

$$T_{cycle} = \max_{allpaths_{p_i}}(\tau_{pi}) \quad \text{Equation 5}$$

Equation 6, provided below, shows, for example, what delay can half of the yielded chips be expect meet with $T_{cycle}$ being $T_{50}$.

$$P(T_{cycle} \leq T_{50}) = 0.5 \quad \text{Equation 6}$$

Let K be the number of independent, parallel paths on a chip that have the same nominal delay path. For $T_{cycle}$ to be, for example, $T_{50}$, all K critical paths, should have delay less than $T_{50}$. That is:

$$P(T_{cycle})=(P(\tau_{Pi}<T_{50}))^k \qquad \text{Equation 7}$$

This means that:

$$(P(\tau_{Pi}<T_{50}))_k=0.5 \qquad \text{Equation 8}$$

or:

$$P(\tau_{Pi}<T_{50})=(0.5)^{(1/k)} \qquad \text{Equation 9}$$

Figure 13:
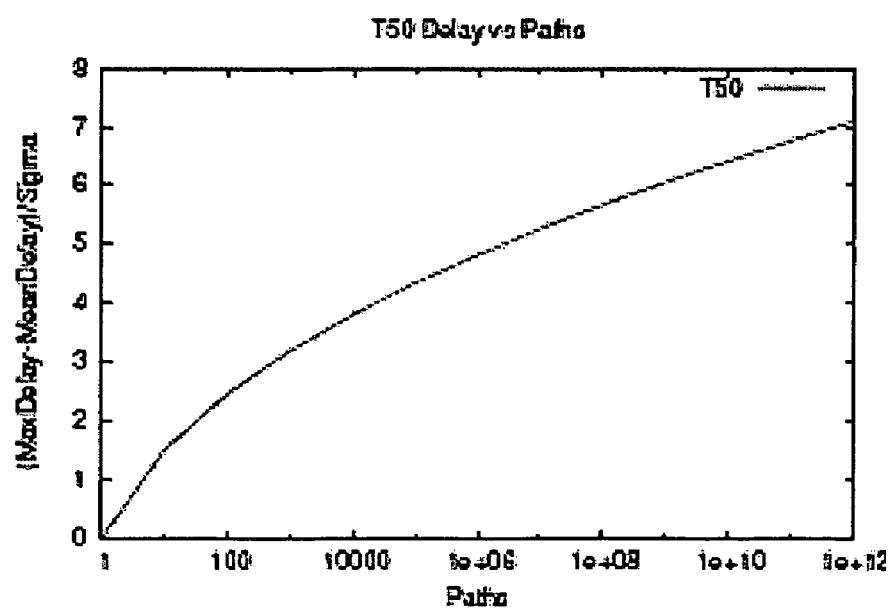
FIG. 13 plots the number of delay seen by 50% of the fabricated ICs in terms of the sigma above the mean single path delay as a function of the number of independent paths in the IC.

When K is large, this means that $P(\tau_{pi}<T_{50})$ must be a value very close to 1; or equivalently, many sigma away from the mean. FIG. 13 plots the number of sigma above the mean as a function of K.

This suggests: that the more critical paths the chip has, the slower the final circuit delay is going to be. As devices are scaled to larger ICs, and hence more paths, the circuit-level effect will increase. Unlike a conventional design where the variation is assumed to be zero, the more paths which end up critical or near critical, the slower the expected delay of the circuit.

The following is a concrete example using the above formulas. Lets assume that d=9 (clock cycles have been trending to 8 gate delays as described in Vikas Agarwal, M. S: Hrishikesh, Stephen W. Keckler, and Doug Burger. Clock Rate versus IPC: The End of the Road for Conventional Microarchitectures, incorporated herein by reference in its entirety. In Proceedings of the International Symposium on Computer Architecture, pages 248-259, 2000, incorporated herein by reference in its entirety, and 9 has a convenient square root. Let's take K=$10^9$ (if the paths were independent, this means at least $10^{10}$ devices if there were no fanin. Since there will be fanin, this is probably more like $10^{11}$ devices). Therefore, above formulas provide the following:

$$P(\tau_{Pi}<T_{50})=(0.5)^{(10^{-9})}$$

$$P(\tau_{Pi}<T_{50})=0.9999999993$$

$$>1-1\times10^{-9} \qquad \text{Equation 10}$$

To have a probability this large of achieving the requisite $T_{50}$ path delay, there may be about 6 sigma out (upper tail of guassian 6 sigma out is about $1\times10^{-9}$). Consequently:

$$T_{50}=\overline{\tau_{path}}+6\times\tau_{path} \qquad \text{Equation 11}$$

In view of the above, because the slowest path paces the speed of the circuit, fixing the slowest path may speed up the circuit. However, once that is done, there will be a new slowest path, at which time the same strategy can be used to fix the next slowest path. In this way, the circuit can be incrementally improved. This kind of incremental improvement is probably not effective at obtaining the global optimum circuit mapping, but it is likely to be highly effective at getting rid of the few very slow paths that make pace the circuit.

This incremental remapping requires the knowledge of which path (or which cycle in an asynchronous system) is the one limiting performance. One-way to determine which path is the slowest in a synchronous system is to use a sample clock a variable distance before the main clock. The sample clock can be varied until just one or a few outputs on that clock do not match the system clock. Those few outputs then are identified as the slow paths. Using the Razor latch approach would be similar. There, at the speed where the system begins to fail, the failing outputs can be identified. In an asynchronous system, an arbiter may be used on completion signals to identify the slowest cycle. In a buffered, streaming system (e.g. SCORE, buffered asynchronous systems), looking at buffer fullness may help to identify the slow paths. See an article by Andre' DeHon and Yury Markovsky and Eylon Caspi and Michael Chu and Randy Huang and Stylianos Perissakis and Laura Pozzi and Joseph Yeh and John Wawrzynek "Stream Computations Organized for Reconfigurable Execution," Journal of Microprocessors and Microsystems, vol. 30, no. 6, pages 334-354, date September of 2006, incorporated herein by reference in its entirety.

Another way to determine which path is slowest is by using arbiter. If two events occur sufficiently far apart, the arbiter can determine which occurred first (if they are too close together, it will pick one of them, but there may be no guarantee on which it picks in this case). An asynchronous arbiter can be used to determine which asynchronous event occurs first. It can also be used in a synchronous system to determine which of two events (e.g. output changes) occurs first. As such, it can be used to determine which output(s) are the slow ones which are limiting the speed of a circuit.

Once a slow output is known, a slow cone of logic can be identified. After measuring the delays in that logic cone, it can be remapped. This would result in the same thing as above, but only on a small subset of the circuit, which might be important for rapid repair during operation.

However, if there is no measurement data, another solution would be to remap the circuit oblivious to delays. To obtain a good result, randomness may be introduced into the mapping. This could be done directly in the algorithm; e.g. in the nanowire assignment portion, Pterms may be assigned randomly to one of the physical nanowires that could support the pterm. Alternately, random delays may be generated according to the variation model to serve as the database model for the circuit; then the problem is mapped as done above. The effect of this random mapping is that each mapping would be different. Consequently, the analysis described above applies to this individual mapping. As a consequence, there is low probability that this individual mapping is very bad. It follows, with high probability, this local remapping will achieve a speed near the mean. Consequently, it will likely not be the slowest path. As a consequence, this random remapping provides a way to push the critical path near the mean.

To put this in context, if all the paths (all the portions of the circuit) are mapped, then the paths will likely be guassian distributed as described above. If the circuit has many paths, then due to the aforementioned effect of sampling many paths, there is high likelihood that a few slow paths are obtained. This remapping then, allows remapping of just those slow paths. With high likelihood, the remapping makes those paths faster. Consequently, by removing the slow paths, the system delay is edged toward the mean delay rather than several sigma slower than the mean.

There is always a chance that a slower mapping is obtained than was previously achieved.

1) If this is a slow path to begin with, then this is path is likely to be slower than its neighbors. Consequently, it is more likely to improve than to get slower.

2) If it does get slower, it can be remapped again. If the path was previously near the mean and a bad mapping was obtained, it is possible (with a few mapping tries) to find one near the mean.

To keep things from get worse, one could:

a) keep a record of old mappings; if things get worse, restore the old mapping which is known to be better;

b) keep a record of old speeds achieved; in this way it is possible to avoid storing all the data for a mapping, but estimate the distribution of delays achievable for the path, with this estimate, it is possible to identify when a relatively good mapping is achieved without try to obtain a better mapping.

Consequently, it is possible to avoid all the bad effects of worse remapping by remapping the circuit multiple times, even if the mapping is performed randomly on each trial.

Above, remapping a path was described. However, the actual remapping will probably be tied to the structure of the reconfigurable logic. In a nanoPLA or other Pterm-based architecture, remapping may be performed on individual nanoPLA blocks that intersect the cone in question. In an FPGA, reassignment may be preformed within a cluster. In either, a region of the chip (say an M×M subarray) may be picked and remapped.

Granularity

Following two granularities may be relevant here:

1) granularity of the logical design
2) granularity of the architecture or physical implementation For the logical design, individual pterms, gates, and interconnect would be the finest granularity. Above that, there are logic cones and individual outputs as described above. Above that, things may be grouped together into functional units (e.g. an adder, multiplier, ALU, DCT, S-Box). Several operators may be grouped together into a pipeline (e.g. a FIR filter pipeline, a floating-point pipeline, or even the pipeline of a processor). In some designs, there may be independent blocks which essentially form their own thread of control. They contain a finite-state machine controller, some datapath, and perhaps memory. In some schemes these are called FSMD's (FSM+Datapath). In some (especially streaming designs) these are called actors. Going up in the granularity hierarchy, it is possible to reduce the overhead for checking during normal operation, but this increases the scope of the logic involved for remapping; consequently, there is a natural tradeoff around the granularity at which this remapping is preformed.

The reconfigurable architecture also has granularities. At the lowest level there may be individual wires, physical Pterms, and LUTs. As noted before, Pterms are grouped into two-level PLA arrays and LUTs are organized in Clusters. There is always locality between Clusters or PLAs, so larger collections of these are often a natural granularity in the reconfigurable fabric. In the SCORE design, a "Page" is a collection of a fixed number of LUT dusters. See an article by Andre' DeHon and Yury Markovsky and Eylon Caspi and Michael Chu and Randy Huang and Stylianos Perissakis and Laura Pozzi and Joseph Yeh and John Wawrzynek "Stream Computations Organized for Reconfigurable Execution," Journal of Microprocessors and Microsystems, vol. 30, no. 6, pages 334-354, date September of 2006, incorporated herein by reference in its entirety. Logically, at least, modern FPGA designs (e.g. Virtex) have reconfigurable stripes or blocks (rectangular regions which can be reconfigured together). The top level granularity in any IC is the entire IC.

Figure 14:
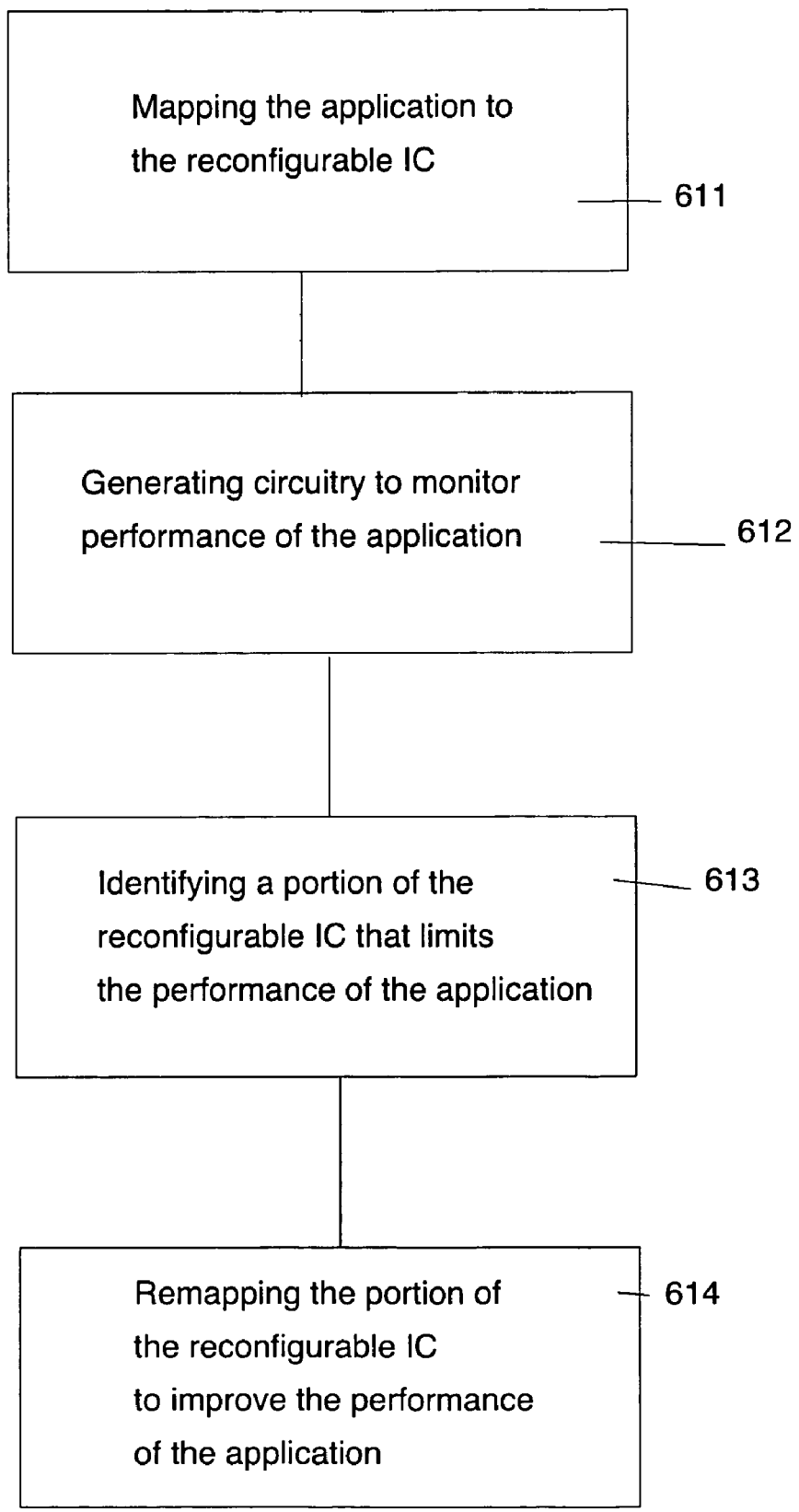
FIG. 14 depicts a method for improving performance of an application running on a reconfigurable integrated circuit (IC)

FIG. 14 depicts a method for improving performance of an application running on a reconfigurable integrated circuit (IC). According to FIG. 14, an application is mapped to the reconfigurable IC (611); circuitry to monitor performance of the application is generated (612); a portion of the reconfigurable IC that limits the performance of the application is identified (613); and the portion of the reconfigurable IC is remapped to improve the performance of the application (614).

According to a third aspect of the present disclosure, performance degradation across the lifetime of an integrated circuit (IC) may be reduced by monitoring correctness or speed during operation, detecting when the IC fails or slows down, remapping the device to avoid components which have slowed; and performance of an integrated circuit (IC) over its lifetime may be maintained by providing spare resources that can be used as devices slow/age, monitoring correctness or speed during operation, detecting when fails or slows down, remapping the device to avoid components which have slowed.

Due to increased susceptibility of small devices to lifetime changes, over the lifetime of a component, performance of the devices degrades. It follows that over the operational lifetime of the IC, device characteristics will vary. Many of these effects cause individual devices to become slower (e.g. hot carrier, NBTI, electromigration).

In addition to fabrication-time variation, parameters will change over the lifetime of devices. Individual atomic bonds may break or metal may migrate increasing the resistance of a device or wire. Device characteristics may shift due to hot carrier injection, NBTI, or even accumulated radiation doses.

The conventional solution is simply to margin the part. Specifically, mark the part slower by some amount (typically 10-20%), with the idea that the device will continue to operate correctly during its lifetime until it slows down between this extra margin. The margin is selected so the device will not fail for some intended lifespan (e.g. 3 years, 10 years, 30 years).

With the techniques introduced above, it is possible to run the component as fast as the devices allow if a circuit to monitor the operation of the circuit is included. This can, again, be Razor-style latches or sample registers. Alternately, it could be concurrent error detection circuitry. It is even possible to simply use intermittent testing of the mapped circuit. When a device slows down to the point where it affects correct operation at the current, operating clock speed, this monitoring circuitry will be triggered. By stalling normal operation to avoid producing any incorrect results, it is possible to remap the circuit. This can be as simple as re-invoking the component-specific mapping described earlier. To minimize down time, the devices can be strategically re-measured in the cone of the failing logic, that can be used to update the existing device delay database and remap the logic with the new database. This remapping now has the opportunity to replace the slow, aged device with a faster device. In this manner, it is possible to minimize the slowdown from aging.

The above solution works well with the incremental remapping described above. In both cases, there is a need to monitor the circuit online for correctness and take appropriate action when they detect that a critical delay has changed. The incremental remapping provides another approach for recovering performance after a device has slowed down.

If there are substitutable devices around which are as fast as the newly slow component needs to be, this remapping can restore the full speed of the mapped circuit. However when the device is in a (near) critical path and most of the resources are already in use, it may not be possible to find such a substitution.

To maintain the full performance of the component over time, it is possible to allocate spare resources during the mapping phase. Rather than greedily using all the fastest resources available, a reserve of fast resources can be set aside for use during the lifetime of the component. When a resource becomes slow enough to impact the performance of the component, one of the reserved resources can be substituted to regain the lost speed. This is related to the conventional approach of allocating a margin for future device changes. Here, the spare capacity is provided in space, allowing the achievement of the same performance as the original mapping.

Figure 15:
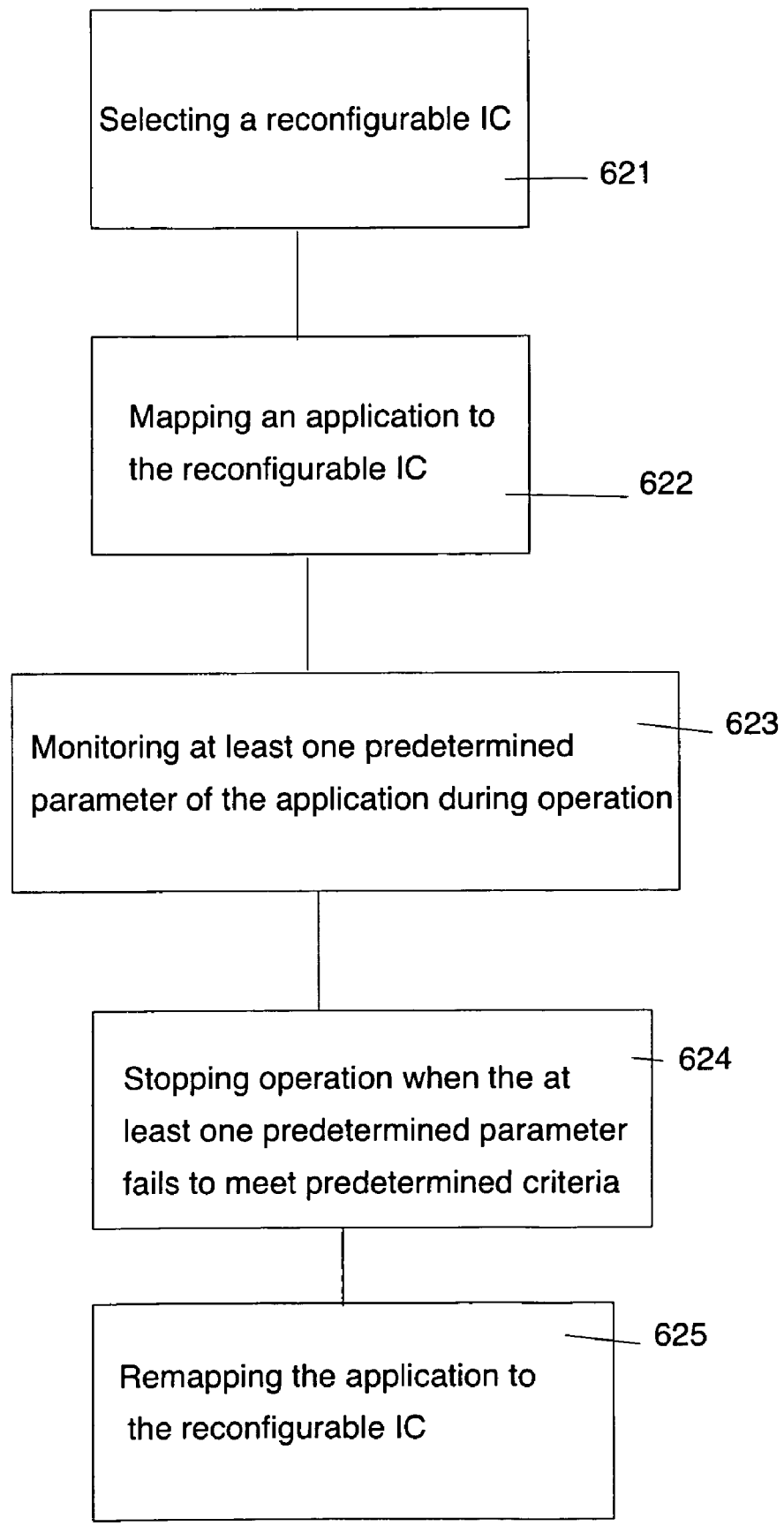
FIG. 15 depicts a method for reducing degradation of an integrated circuit (IC) over time.

FIG. 15 depicts a method for reducing degradation of an integrated circuit (IC) over time. According to FIG. 15, a reconfigurable IC is selected (621); an application is mapped to the reconfigurable IC (622); at least one predetermined parameter of the application is being monitored during operation (623); when the at least one predetermined parameter fails to meet predetermined criteria the operation is stopped (624); and the application is remapped to the reconfigurable IC (625).

Figure 16:
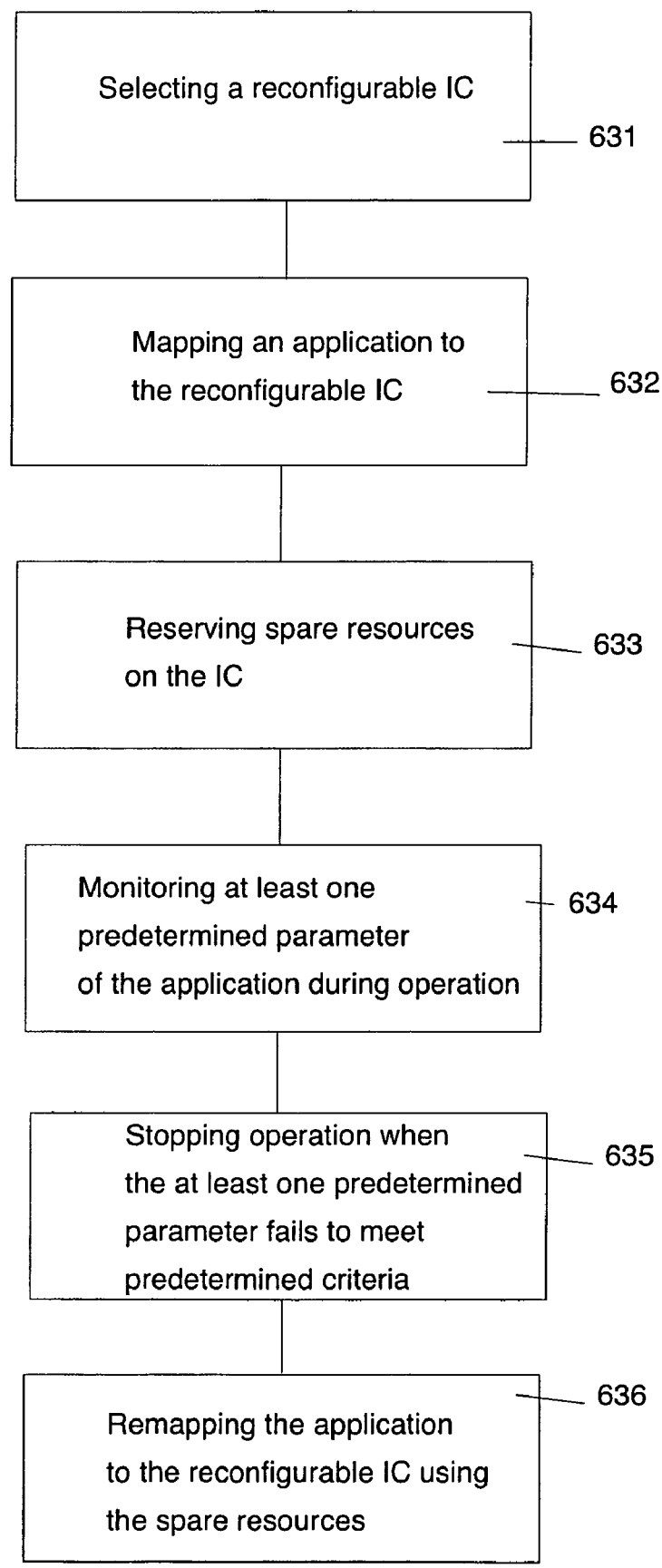
FIG. 16 depicts a method for maintaining performance of an integrated circuit (IC) time.

FIG. 16 depicts a method for maintaining performance of an integrated circuit (IC) time. According to FIG. 16, a reconfigurable IC is selected (631); an application is mapped to the reconfigurable IC (632); spare resources are reserved on the IC (633); at least one predetermined parameter of the application is monitored during operation (634); when the at least one predetermined parameter fails to meet predetermined criteria the operation is stopped (635); and the application is remapped to the reconfigurable IC using the spare resources (636).

Concurrent-Error Detecting Logic

Errors can be detected by computing some property of the output of a computation in parallel with the computation and then checking whether or not the output holds the computed property. The most trivial case is to duplicate the computation. Specifically, compute the computation twice, in parallel, and compare the output. If they match, then there are no errors. If they mismatch, there is at least one error present. While duplication is simple, it is potentially expensive. Other properties such as the parity of the outputs can be computed. In this manner a single output bit is produced, and a checker is provided that computes the parity of the output and this output bit. Again, if there are no errors, the parity will match. This can be generalized to separate parities on various output subsets or other functions on the outputs. Further, outputs can be protected with more than one copy; for example, there can be multiple, overlapping parities, or duplication can be replaced with a larger number of replicas than one. See the paper by Subhashish Mitra and Edward J. McCluskey "Which Concurrent Error Detection Scheme to Choose?" Proceedings of the International Test Conference, pages 985-994, 2000, incorporated herein by reference in its entirety.

For component devices that are slowing down, as long as the devices do not age identically, concurrent error detection will allow detection as soon as one device becomes too slow. For example, in duplication, if one copy slows down and the other does not, the event will be detected. Since detection is made on a cycle-by-cycle basis the probability that both copies slow down at exactly the same time is very small.

Figure 17A:
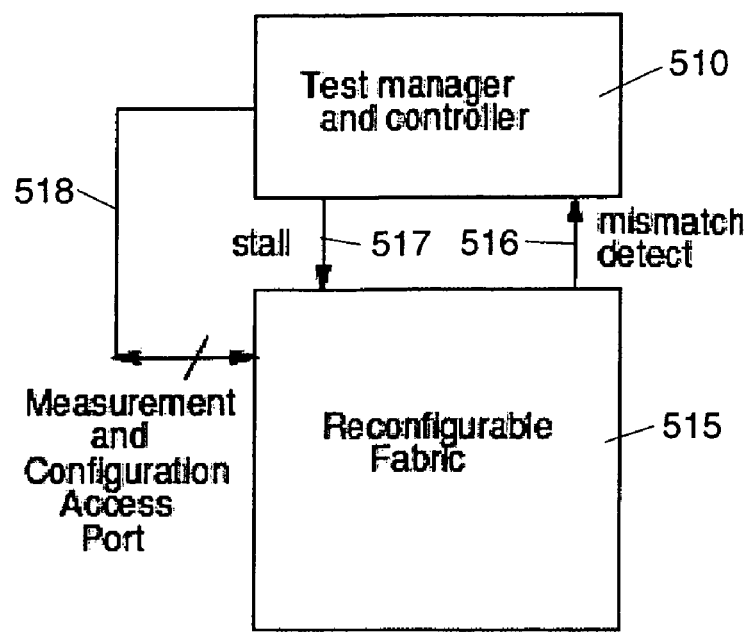
FIGS. 17a-c depict a test controller.

Referring to FIG. 17a, the features of the present disclosure may be implemented using a test controller 510 that is separate from a reconfigurable IC 515. The reconfigurable IC 515 is able to signal when it detects errors using mismatch detect 516. Upon receipt of the signal from the mismatch detect 516, the test controller 510 can stall normal operation using stall signal 517 for testing and reconfiguration. The test controller 510 and the reconfigurable IC 515 may also contain a configuration port 518 to configure the reconfigurable IC 515. One skilled in the art will understand that ports 517, 516 and 518 may be separate or combined; further ports 517, 516 and 518 could also be shared with other operations. In some embodiments the test controller 510 is responsible for stalling the logic. In other embodiments, the reconfigurable IC 515 may be adapted to automatically stall itself as soon as it detects and error and simultaneously signal the error to the test controller 510.

Figure 17B:
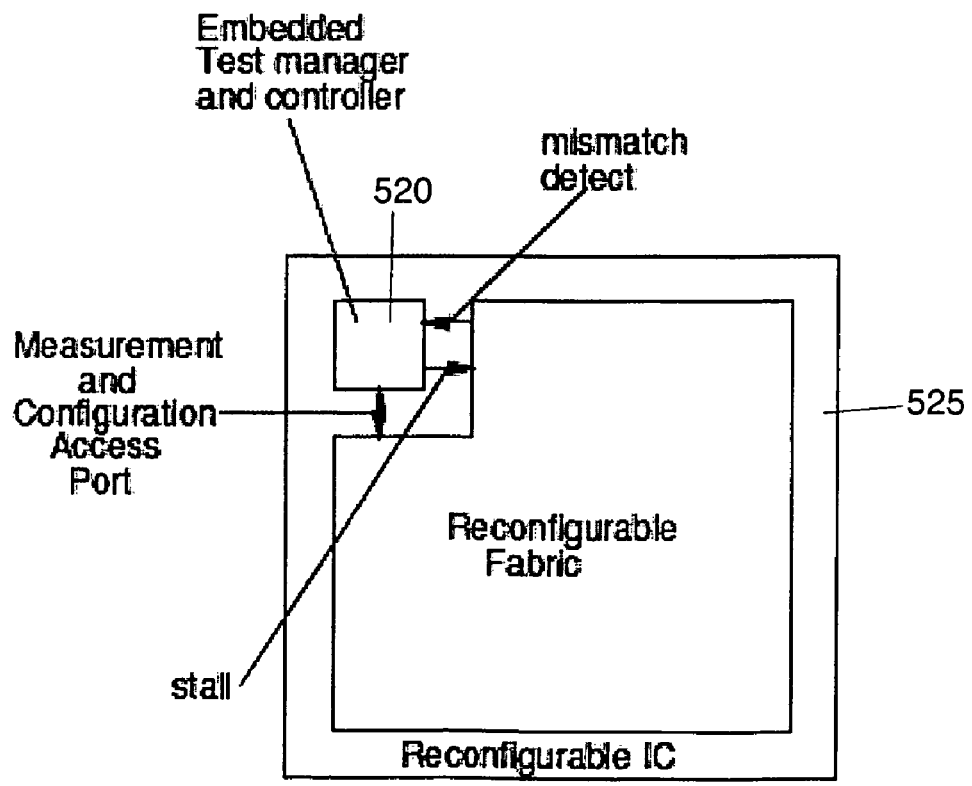

Referring to FIG. 17b, the features of the present disclosure may be implemented to use a test controller 520 that is integrated, for example, on the same die with the reconfigurable IC 525. For nanoscale reconfigurable logic, the test controller 520 may be implemented in reliable CMOS logic, perhaps even with coarser features. Using coarse-feature, reliable CMOS means that the controller will have higher yield and not be susceptible to variation and lifetime failures nanoscale logic.

The controller could be implemented with a microprocessor or microcontroller.

Figure 17C:
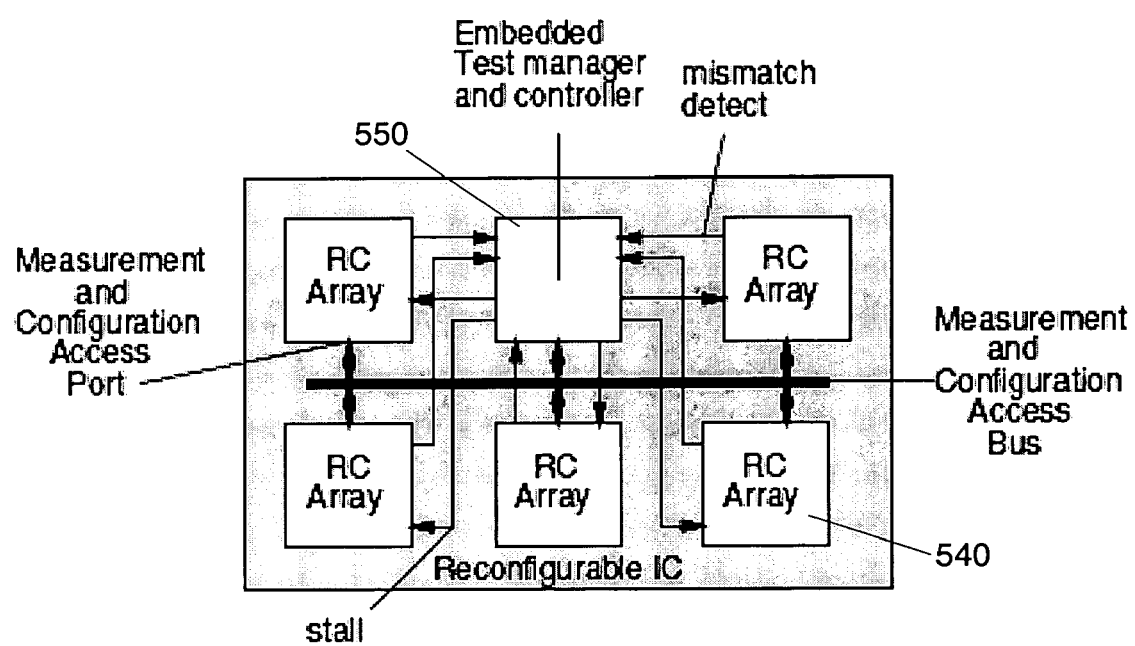

The reconfigurable fabric on a single chip may be decomposed into separate regions which separately detect errors, stall, and/or reconfigure as shown in FIG. 17c. According to FIG. 17c, each RC array block 540 may share a single test controller 550.

Figure 18:
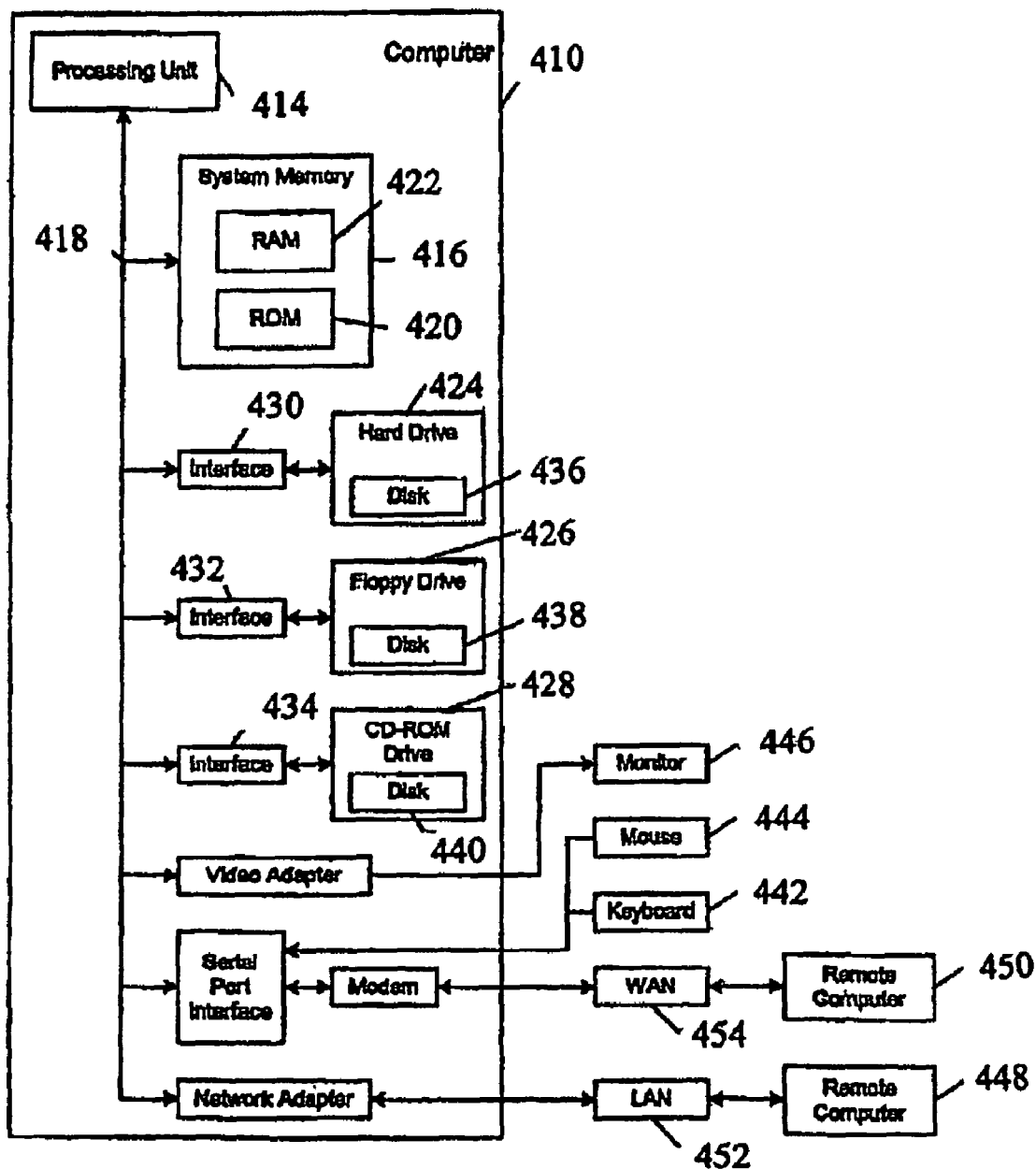
FIG. 18 depicts a computer.

Referring to FIG. 18, features of the present disclosure may be implemented as one or more respective software modules operating on a computer 410. Computer 410 includes a processing unit 414, a system memory 416, and a system bus 418 that couples processing unit 414 to the various components of computer 410. Processing unit 414 may include one or more processors, each of which may be in the form of any one of various commercially available processors. System memory 416 includes a read only memory (ROM) 420 that stores a basic input/output system (BIOS) containing start-up routines for computer 410, and a random access memory (RAM) 422. System bus 418 may be a memory bus, a peripheral bus or a local bus, and may be compatible with any of a variety of bus protocols, including PCI, VESA, Microchannel, ISA, and EISA. Computer 410 also includes a hard drive 424, a floppy drive 426, and CD ROM drive 428 that are connected to system bus 418 by respective interfaces 430, 432, 434. Hard drive 424, floppy drive 426, and CD ROM drive 428 contain respective computer-readable media disks 436, 438, 440 that provide non-volatile or persistent storage for data, data structures and computer-executable instructions. Other computer-readable storage devices (e.g., magnetic tape drives, flash memory devices, and digital video disks) also may be used with computer 410. A user may interact (e.g., enter commands or data) with computer 410 using a keyboard 442 and a mouse 444. Other input devices (e.g., a microphone, joystick, or touch pad) also may be provided. Information may be displayed to the user on a monitor 446. Computer 410 also may include peripheral output devices, such as speakers and a printer. One or more remote computers 448 may be connected to computer 410 over a local area network (LAN) 452, and one or more remote computers 450 may be connected to computer 410 over a wide area network (WAN) 454 (e.g., the Internet).

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "step(s) for . . . ."

What is claimed is:

1. A method for increasing yielded performance of a reconfigurable integrated circuit comprising integrated circuit components and connections, the method comprising:
   selecting a reconfigurable integrated circuit;
   measuring a timing delay of the integrated circuit components and connections;
   mapping a target application to the reconfigurable integrated circuit based on the measured timing delay, the mapping comprising
   placement of clusters;
   routing between the clusters; and
   assignment of lower-level primitives inside the clusters, wherein the assignment of the lower-level primitives comprises:
      picking a most critical function from a set of functions to be assigned;
      assigning the most critical function to a fastest resource from a set of resources;
      removing the most critical function from the set of functions;
      removing the fastest resource from the set of resources; and
      repeating the picking, the assigning and the removing until all functions in the set of functions are assigned to resources in the set of resources; and
   programming the reconfigurable integrated circuit based on the mapping of the target application.

2. The method of claim 1, wherein the reconfigurable integrated circuit is selected from the group comprising a Field Programmable Grid Array (FPGA), a Programmable Logic Device (PLD), a coarse-grained configurable integrated circuit, a nanowire-based programmable device, and a crossbar-based programmable circuit.

3. The method of claim 1, wherein the integrated circuit components and connections are selected from the group comprising wire segments, programmable switches, buffered switches, multiplexers, LUTs, Pterms, ALUs, and memory blocks.

4. The method of claim 1, wherein the measuring of the timing delay comprises adopting ring-oscillators or configuring ring-oscillators from the components and connections on the reconfigurable integrated circuit.

5. The method of claim 1, wherein measuring of the timing delay comprises:
   configuring the integrated circuit components and connections into specific arrangements;
   clocking changes through the specific arrangements of the configured integrated circuit components and connections; and
   adjusting the clock to determine the speed of the configured integrated circuit components and connections.

6. The method of claim 1, wherein measuring of the timing delay is performed with a sample register adapted to store values of logic signals before or after a clock edge.

* * * * *